(12) United States Patent
Park et al.

(10) Patent No.: US 11,622,064 B2
(45) Date of Patent: Apr. 4, 2023

(54) SUBSTRATE FOR IMAGE SENSOR

(71) Applicant: LG INNOTEK CO., LTD., Seoul (KR)

(72) Inventors: Duck Hoon Park, Seoul (KR); Jee Heum Paik, Seoul (KR); Young Joon Son, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/294,625

(22) PCT Filed: Nov. 14, 2019

(86) PCT No.: PCT/KR2019/015531
§ 371 (c)(1),
(2) Date: May 17, 2021

(87) PCT Pub. No.: WO2020/105956
PCT Pub. Date: May 28, 2020

(65) Prior Publication Data
US 2022/0014654 A1 Jan. 13, 2022

(30) Foreign Application Priority Data

Nov. 20, 2018 (KR) .......................... 10-2018-0143392
Jan. 8, 2019 (KR) .......................... 10-2019-0002156

(51) Int. Cl.
*H04N 5/225* (2006.01)
*H04N 5/232* (2006.01)
(Continued)

(52) U.S. Cl.
CPC ..... *H04N 5/2253* (2013.01); *H01L 27/14618* (2013.01); *H02K 41/031* (2013.01);
(Continued)

(58) Field of Classification Search
CPC ............. H04N 5/2257; H04N 5/23212; H04N 5/2253; H04N 5/23287; H01L 27/14618;
(Continued)

(56) References Cited

U.S. PATENT DOCUMENTS 8,248,497 B2    8/2012   Tanimura et al.
8,605,160 B2   12/2013   Kwon et al.
(Continued)

FOREIGN PATENT DOCUMENTS

JP    62-134992 A    6/1987
JP    2008-203402 A  9/2008
(Continued)

OTHER PUBLICATIONS

International Search Report dated Feb. 27, 2020 in International Application No. PCT/KR2019/015531.
(Continued)

*Primary Examiner* — Nelson D. Hernández Hernández
(74) *Attorney, Agent, or Firm* — Saliwanchik, Lloyd & Eisenschenk

(57) ABSTRACT

A substrate for an image sensor according to an embodiment includes an insulating layer; and a conductive pattern portion disposed on the insulating layer, wherein the insulating layer comprises: a first insulating part; and a second insulating part surrounding the first insulating part and spaced apart from the first insulating part with an open region therebetween, wherein the conductive pattern portion comprises a first lead pattern part disposed on the first insulating part; a second lead pattern part disposed on the second insulating part; and an extension pattern part disposed on the open region of the insulating layer to connect the first lead pattern part with the second lead pattern part and including a bent portion.

19 Claims, 25 Drawing Sheets

(51) Int. Cl.
  *H01L 27/146* (2006.01)
  *H02K 41/03* (2006.01)
  *G02B 7/02* (2021.01)
(52) U.S. Cl.
  CPC ......... *H04N 5/23287* (2013.01); *G02B 7/021* (2013.01); *H02K 2201/18* (2013.01)
(58) Field of Classification Search
  CPC .. H02K 41/031; H02K 2201/18; G02B 7/021; H05K 2201/10121; H05K 2201/10151; H05K 1/189
  See application file for complete search history.

(56) References Cited

U.S. PATENT DOCUMENTS

| | | |
|---|---|---|
| 9,420,185 B2 | 8/2016 | Oh |
| 10,516,348 B2 | 12/2019 | Liu et al. |
| 11,199,182 B2 | 12/2021 | Miller et al. |
| 2006/0092514 A1 | 5/2006 | Koo et al. |
| 2013/0107068 A1 | 5/2013 | Kim et al. |
| 2015/0341534 A1 | 11/2015 | Ng et al. |
| 2017/0133951 A1 | 5/2017 | Liu et al. |
| 2018/0171991 A1 | 6/2018 | Miller et al. |
| 2019/0141248 A1* | 5/2019 | Hubert ............... H04N 5/23287 |
| 2022/0099072 A1 | 3/2022 | Miller et al. |

FOREIGN PATENT DOCUMENTS

| | | |
|---|---|---|
| JP | 2012-103376 A | 5/2012 |
| JP | 2013-72967 A | 4/2013 |
| KR | 10-0646560 B1 | 11/2006 |
| KR | 10-2013-0119706 A | 11/2013 |
| KR | 10-2014-0073238 A | 6/2014 |
| KR | 10-2017-0021682 A | 2/2017 |
| KR | 10-2018-0081087 A | 7/2018 |
| WO | WO-2017/156462 A1 | 9/2017 |
| WO | 2018/112436 A1 | 6/2018 |

OTHER PUBLICATIONS

Office Action dated May 10, 2022 in Japanese Application No. 2021-527093.
Supplementary European Search Report dated Jul. 18, 2022 in European Application No. 19886532.1.
Office Action dated Oct. 15, 2022 in Korean Application No. 10-2018-0143392.

* cited by examiner

SUBSTRATE FOR IMAGE SENSOR

CROSS-REFERENCE TO RELATED APPLICATIONS

This application is the U.S. national stage application of International Patent Application No. PCT/KR2019/015531, filed Nov. 14, 2019, which claims the benefit under 35 U.S.C. § 119 of Korean Application Nos. 10-2018-0143392, filed Nov. 20, 2018; and 10-2019-0002156, filed Jan. 8, 2019, the disclosures of each of which are incorporated herein by reference in their entirety.

TECHNICAL FIELD

An embodiment relates to a substrate for an image sensor. Specifically, the embodiment relates to a substrate for an image sensor capable of moving relative to a lens barrel and a camera module including the same.

BACKGROUND ART

In general, camera devices are mounted in mobile communication terminals and portable devices such as MP3 players, as well as electronic devices such as automobiles, endoscopes, and CCTVs. Such camera devices are gradually being developed centering on high pixels, and miniaturization and thinning are in progress. In addition, current camera devices are being changed so that various additional functions can be implemented at low manufacturing cost.

The camera device as described above includes a lens barrel accommodating a lens, a lens holder coupled to the lens barrel, an image sensor disposed in the lens holder, and a driving substrate on which the image sensor is mounted. At this time, the lens prod provides an image signal of a subject to the image sensor. And the image sensor converts the image signal into an electrical signal.

Here, the accuracy of the image signal in the camera device is determined according to a focal length defined as the distance between the lens and the image sensor.

Accordingly, the camera device provides focus compensation or shake compensation by moving the lens barrel relative to the image sensor. That is, the camera device moved the lens barrel accommodating the lens relative to the image sensor in the X-axis, Y-axis, and Z-axis. At this time, the camera device required an elastic member such as at least six springs to move the lens barrel. In addition, the elastic member was bonded to the lens barrel by bonding.

However, the camera device according to the prior art as described above, by moving the lens barrel, the upper spring plate disposed on the lens barrel, the lower spring plate under the lens barrel, and an elastic wire for fixing the Z-axis (elastic wire) Includes structures such as Accordingly, the module structure of the camera device according to the prior art has a complicated problem.

In addition, the camera device according to the prior art requires a plurality of elastic members for moving the lens barrel, and there is a problem in that the number of assembling steps of the plurality of elastic members increases.

DISCLOSURE

Technical Problem

In the embodiment, it is possible to provide a substrate for an image sensor having a new structure and a camera module including the same.

In addition, in the embodiment, it is possible to provide an image sensor substrate for an image sensor moving relative to a lens barrel, and a camera module including the same.

In addition, in the embodiment, a substrate for an image sensor capable of not only movement of the X-axis, Y-axis, and Z-axis, but also tilt correction, and a camera module including the same are provided.

In addition, in the embodiment, a substrate for an image sensor capable of simplifying a spring structure for providing an auto focus function or a camera shake compensation function, and a camera module including the same can be provided.

The technical problems to be achieved in the proposed embodiment are not limited to the technical problems mentioned above, and other technical problems not mentioned may be clearly understood by those of ordinary skill in the art to which the proposed embodiment belongs from the following description.

Technical Solution

A substrate for an image sensor according to an embodiment comprises: a spring plate having an elastic member disposed in a first open region; an insulating layer disposed on the spring plate and including a second open region exposing the first open region; and a conductive pattern portion disposed on the insulating layer, wherein the spring plate comprises a first plate part, and a second plate part disposed to surround the first plate part with the first open region interposed therebetween, and connected to the first plate part by the elastic member, wherein the insulating layer includes a first insulating part disposed on the first plate part, and a second insulating part disposed on the second plate part, wherein the conductive pattern portion, a first lead pattern part disposed on the first insulating part, a second lead pattern part disposed on the second insulating part, and an extension pattern part disposed between the first and second lead pattern parts and floating on the second open region.

In addition, the substrate comprises a first bonding sheet disposed between the spring plate and the insulating layer and including a third open region exposing the first open region; and a second bonding sheet disposed between the insulating layer and the conductive pattern portion and including a fourth open region exposing the second open region.

In addition, a length of the extension pattern part is greater than a linear distance between the first lead pattern part and the second lead pattern part.

In addition, the extension pattern part has a length of 1.5 to 4 times the linear distance between the first lead pattern part and the second lead pattern part.

In addition, the extension pattern part does not overlap with the elastic member in a vertical direction.

In addition, the extension pattern part has a tensile strength of 1000 MPa or more.

In addition, the extension pattern part is formed of a binary alloy of any one of copper (Cu)-nickel (Ni), copper (Cu)-tin (Sn), copper (Cu)-beryllium (Be) and copper (Cu)-cobalt (Co), or a ternary alloy of any one of copper (Cu)-nickel (Ni)-tin (Sn) and copper (Cu)-beryllium (Be)-cobalt (Co).

In addition, the first lead pattern part, the second lead pattern part, and the extension pattern part include a metal layer disposed on the insulating layer and the second open region, and a plating layer disposed on the metal layer, wherein the plating layer of the extension pattern part is disposed to surround an upper surface, a side surface, and a lower surface of the metal layer of the extension pattern part.

In addition, a distance between a lower surface of the first lead pattern part and on upper surface of the spring plate is equal to a distance between a lower surface of the second lead pattern part and an upper surface of the spring plate, and a distance between the lower surface of the extension pattern part and the upper surface of the spring plate is smaller than the distance between the lower surface of the first lead pattern part and the upper surface of the spring plate or the distance between the lower surface of the second lead pattern part and the upper surface of the spring plate.

In addition, the spring plate includes a plurality of slits formed passing through an upper surface and a lower surface of the first plate part.

In addition, a plurality of the first lead pattern parts are disposed around an image sensor mounting area on an upper surface of the first insulating part, and wherein each of the second lead pattern part and the extension pattern part includes a plurality of parts to be respectively connected to the plurality of first lead pattern parts.

In addition, the substrate includes a supporting layer disposed under the lower surface of the second plate part.

A camera module according to the embodiment comprises a housing; a lens barrel disposed in the housing; a lens assembly disposed in the lens barrel; an image sensor substrate disposed in the housing; an image sensor disposed on the image sensor substrate; a first driving part disposed on a lower surface of the image sensor substrate; and a second driving part disposed in the housing and having an upper surface facing a lower surface of the first driving part, wherein the image sensor substrate comprise: a spring plate having an elastic member disposed in a first open region; an insulating layer disposed on the spring plate and including a second open region exposing the first open region; and a conductive pattern portion disposed on the insulating layer, wherein the spring plate comprises a first plate part, and a second plate part disposed to surround the first plate part with the first open region interposed therebetween, and connected to the first plate part by the elastic member, wherein the insulating layer includes a first insulating part disposed on the first plate part, and a second insulating part disposed on the second plate part, wherein the conductive pattern portion, a first lead pattern part disposed on the first insulating part, a second lead pattern part disposed on the second insulating part, and an extension pattern part disposed between the first and second lead pattern parts and floating on the second open region.

In addition, the first driving part is disposed under a lower surface of the first plate part, and the second driving part interacts with the first driving part to move the first driving part so that the image sensor substrate is moved relative to the lens barrel in a horizontal direction.

In addition, the camera module comprises a third driving part having an upper surface facing a side surface of the first driving part on a side surface of the supporting layer, and the third driving part interacts with the first driving part to move the first driving part so that the image sensor substrate is moved relative to the lens barrel in a vertical direction.

In addition, the extension pattern part has a length of 1.5 to 4 times a linear distance between the first lead pattern part and the second lead pattern part.

In addition, the extension pattern part does not overlap with the elastic member in a vertical direction.

On the other hand, the camera device according to the embodiment includes a housing; a lens barrel disposed in the housing; a lens assembly disposed in the lens barrel; an image sensor substrate disposed in the housing; an image sensor disposed on the image sensor substrate; and flexible circuit board including a first connector part disposed in the housing and electrically connected to the image sensor substrate, a second connector part disposed outside the housing and electrically connected to an external device, and a connection part connecting the first and second connectors, wherein the image sensor substrate comprise: a spring plate having an elastic member disposed in a first open region; an insulating layer disposed on the spring plate and including a second open region exposing the first open region; and a conductive pattern portion disposed on the insulating layer, wherein the spring plate comprises a first plate part, and a second plate part disposed to surround the first plate part with the first open region interposed therebetween, and connected to the first plate part by the elastic member, wherein the insulating layer includes a first insulating part disposed on the first plate part, and a second insulating part disposed on the second plate part, wherein the conductive pattern portion, a first lead pattern part disposed on the first insulating part, a second lead pattern part disposed on the second insulating part, and an extension pattern part disposed between the first and second lead pattern parts and floating on the second open region.

On the other hand, the substrate for an image sensor according to another embodiment comprises an insulating layer; and a conductive pattern portion disposed on the insulating layer, wherein the insulating layer comprises: a first insulating part; a second insulating part surrounding the first insulating part and spaced apart from the first insulating part with a first open region therebetween, and a extension insulating part disposed in the first open region and connecting the first insulating part and the second insulating part, and the conductive pattern portion comprises: a first lead pattern part disposed on the first insulating part; a second lead pattern part disposed on the second insulating part; and an extension pattern part on the extension insulating part and connecting between the first lead pattern part and the second lead pattern part.

In addition, the substrate comprises a bonding sheet disposed between the insulating layer and the conductive pattern portion and including a second open region exposing the first open region, wherein the bonding sheet comprises: a first bonding part between the first lead pattern part and the first insulating part; and a second bonding part between the second lead pattern part and the second insulating part; and an extension bonding part between the extension pattern part and the extension insulating part.

In addition, a length of the extension insulating part is greater than a linear distance of the first open region between the first insulating part and the second insulating part.

In addition, the extension insulating part has a length of 1.5 to 4 times the linear distance of the first open region between the first insulating part and the second insulating part.

In addition, the extension pattern part, the extension insulating part, and the extension bonding part overlap each other in a vertical direction.

In addition, the length of the extension pattern part is greater than a linear distance between the first lead pattern part and the second lead pattern part.

In addition, the extension pattern part has a length of 1.5 to 4 times the linear distance between the first lead pattern part and the second lead pattern part.

In addition, the extension insulating part has a line width larger than a line width of the extension pattern part.

In addition, the extension pattern part has a tensile strength of 1000 MPa or more.

In addition, the extension pattern part is formed of a binary alloy of any one of copper (Cu)-nickel (Ni), copper (Cu)-tin (Sn), copper (Cu)-beryllium (Be) and copper (Cu)-cobalt (Co), or a ternary alloy of any one of copper (Cu)-nickel (Ni)-tin (Sn) and copper (Cu)-beryllium (Be)-cobalt (Co).

In addition, the first lead pattern part, the second lead pattern part, and the extension pattern part include a metal layer and a plating layer disposed on upper and side surfaces of the metal layer.

In addition, a plurality of the first lead pattern parts are disposed around an image sensor mounting area on an upper surface of the first insulating part, and wherein each of the second lead pattern part and the extension pattern part includes a plurality of parts to be respectively connected to the plurality of first lead pattern parts.

In addition, the substrate comprises a supporting layer disposed under the lower surface of the second insulating part.

On the other hand, the camera module according to the embodiment comprises a housing; a lens barrel disposed in the housing; a lens assembly disposed in the lens barrel; an image sensor substrate disposed in the housing; an image sensor disposed on the image sensor substrate; a first driving part disposed on a lower surface of the image sensor substrate; and a second driving part disposed in the housing and having an upper surface facing a lower surface of the first driving part, wherein the image sensor substrate comprise: an insulating layer; and a conductive pattern portion disposed on the insulating layer, wherein the insulating layer comprises: a first insulating part; a second insulating part surrounding the first insulating part and spaced apart from the first insulating part with a first open region therebetween, and an extension insulating part disposed in the first open region and connecting the first insulating part and the second insulating part, and the conductive pattern portion comprises: a first lead pattern part disposed on the first insulating part; a second lead pattern part disposed on the second insulating part; and an extension pattern part on the extension insulating part and connecting between the first lead pattern part and the second lead pattern part.

In addition, the first driving part is disposed under a lower surface of the first plate part, and the second driving part interacts with the first driving part to move the first driving part so that the image sensor substrate is moved relative to the lens barrel in a horizontal direction.

In addition, the camera module comprises a third driving part having an upper surface facing a side surface of the first driving part on a side surface of the supporting layer, and the third driving part interacts with the first driving part to move the first driving part so that the image sensor substrate is moved relative to the lens barrel in a vertical direction.

In addition, the extension pattern part has a length of 1.5 to 4 times a linear distance between the first lead pattern part and the second lead pattern part.

On the other hand, the camera device according to the embodiment includes a housing; a lens barrel disposed in the housing; a lens assembly disposed in the lens barrel; an image sensor substrate disposed in the housing; an image sensor disposed on the image sensor substrate; and flexible circuit board including a first connector part disposed in the housing and electrically connected to the image sensor substrate, a second connector part disposed outside the housing and electrically connected to an external device, and a connection part connecting the first and second connectors, wherein the image sensor substrate comprise: an insulating layer; and a conductive pattern portion disposed on the insulating layer, wherein the insulating layer comprises: a first insulating part; a second insulating part surrounding the first insulating part and spaced apart from the first insulating part with a first open region therebetween, and an extension insulating part disposed in the first open region and connecting the first insulating part and the second insulating part, and the conductive pattern portion comprises: a first lead pattern part disposed on the first insulating part; a second lead pattern part disposed on the second insulating part; and an extension pattern part on the extension insulating part and connecting between the first lead pattern part and the second lead pattern part, wherein the first connector part includes a pad part disposed on the second insulating part and connected to the second lead pattern part, wherein the extension pattern part has a length of 1.5 to 4 times the linear distance between the first lead pattern part and the second lead pattern part, and wherein the extension insulating part has a line width larger than a line width of the extension pattern part.

Effects of the Invention

According to an embodiment, in order to implement the OIS and AF functions of the camera module, instead of moving the conventional lens barrel, the image sensor is moved relative to the lens barrel in the X-axis, Y-axis and Z-axis directions. Accordingly, the camera module according to the embodiment may remove a complex spring structure for implementing the OIS and AF functions, and thus the structure may be simplified. In addition, by moving the image sensor according to the embodiment relative to the lens barrel, it is possible to provide a stable structure compared to the conventional structure.

In addition, according to an embodiment, the extension pattern part electrically connected to the image sensor has a spring structure and is disposed in a floating form on the spring plate.

In addition, in the insulating layer, an extension insulating part having a spring shape is disposed in a region vertically overlapping with the extension pattern part. Accordingly, the camera module may elastically support the image sensor more stably and move the image sensor with respect to the lens barrel.

In addition, the length of the extension pattern part in the embodiment is set to be at least 1.5 to 4 times the linear distance between the first lead pattern part and the second lead pattern part. Accordingly, noise generation can be minimized while improving the mobility of the image sensor substrate.

In addition, in the embodiment, the width of the extension insulating part is made larger than the width of the extension pattern part, so that the extension pattern part can be stably supported by the extension insulating part, thereby improving operational reliability.

In addition, according to the embodiment, the elastic member and the extension pattern part are not aligned with each other in a vertical direction, thereby solving an electrical reliability problem that may occur due to contact between the elastic member and the extension pattern part.

BEST MODE

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (A, and (b) may be used.

These terms are only used to distinguish the elements from other elements, and the terms are not limited to the essence, order, or order of the elements. In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

Hereinafter, embodiments of the present disclosure will be described in detail with reference to the accompanying drawings.

Figure 1:
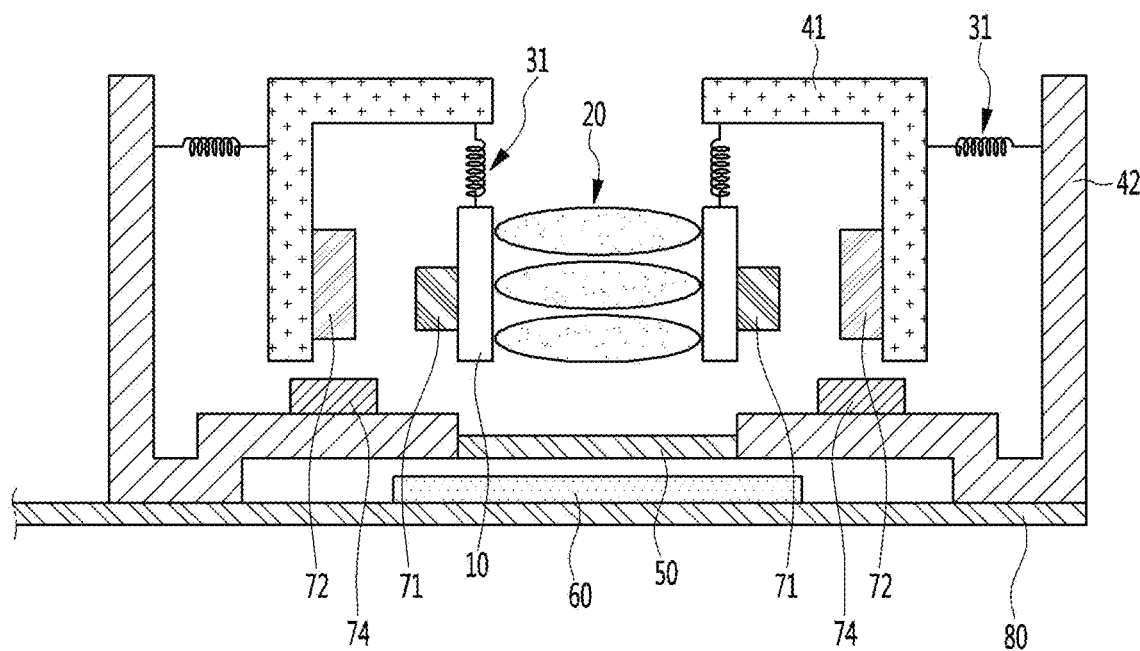
FIG. 1 is a view showing a camera module according to a comparative example.

FIG. 1 is a view showing a camera module according to a comparative example.

A camera module having an optical image stabilizer (OIS) function and an Auto Focusing (AF) function requires at least two spring plates.

The camera module according to the comparative example may have two spring plates. The camera module according to the comparative example requires an elastic member such as at least six springs for the spring plate.

Referring to FIG. 1, the camera module according to the comparative example includes an optical system including a lens assembly, an infrared cut-off filter, and a sensor unit. That is, the camera module according to the comparative example includes a lens barrel 10, a lens assembly 20, a first elastic member 31, a second elastic member 32, a first housing 41, a housing 42, an infrared cut-off filter 50, a sensor unit 60, a circuit board 80, and driving parts 71, 72, 73, and 74.

In this case, the lens barrel 10 is connected to the first housing 41. That is, the lens barrel 10 is connected to the first housing 41 via the first elastic member 31. That is, the lens barrel 10 is connected to the first housing 41 so as to be movable by the first elastic member 31. In this case, the first elastic member 31 includes a plurality of springs (not shown). For example, the first elastic member 31 connects between the lens barrel 10 and the first housing 41 at a plurality of points of the lens barrel 10.

The second elastic member 32 is connected to the first housing 41 and the second housing 42 accommodating the first housing 41. The second elastic member 32 fixes the first housing 41 to the second housing 42 so as to be movable.

The second elastic member 32 includes a plurality of springs. In detail, the second elastic member 32 includes a plate-shaped spring.

In this case, the first elastic member 31 moves the lens barrel 10 relative to the sensor unit 60 in a vertical direction (a Z-axis direction) while supporting the lens barrel 10. To this end, the first elastic member 31 includes at least four springs.

In addition, the second elastic member 32 moves the lens barrel 10 relative to the sensor unit 60 in a horizontal direction (an X-axis direction and a Y-axis direction) while supporting the lens barrel 10. To this end, the second elastic member 32 includes at least two springs.

As described above, in the camera module according to the comparative example, OIS and AF are performed as the lens barrel 10 moves in the X-axis, Y-axis, and Z-axis directions. To this end, the camera module according to the comparative example requires at least six elastic members such as springs. In addition, the camera module according to the comparative example requires two spring plates for supporting the elastic member as described above. Further, the camera module according to the comparative example requires an additional member such as an elastic wire for fixing the Z-axis of the lens barrel 10. Therefore, the camera module according to the comparative example has a complicated spring structure for moving the lens barrel in the X-axis, Y-axis and Z-axis directions.

In addition, in the camera module according to the comparative example, it is necessary to manually perform an operation of bonding the respective elastic members in order to couple the elastic member with the lens barrel 10. Accordingly, the camera module according to the comparative example has a complicated manufacturing process and requires a long manufacturing time.

In addition, the camera module according to the comparative example provides a tilt function of the lens barrel 10, but has a structure in which tilt correction of an image is substantially difficult. That is, even though the lens barrel 10 rotates with respect to the sensor unit 60, an image incident on the sensor unit 60 does not change, and thus the tilt correction of the image is difficult, and further, the tilt function itself is unnecessary.

Hereinafter, a substrate for an image sensor, a camera module, and a camera device including the same according to an embodiment will be described.

Figure 2:
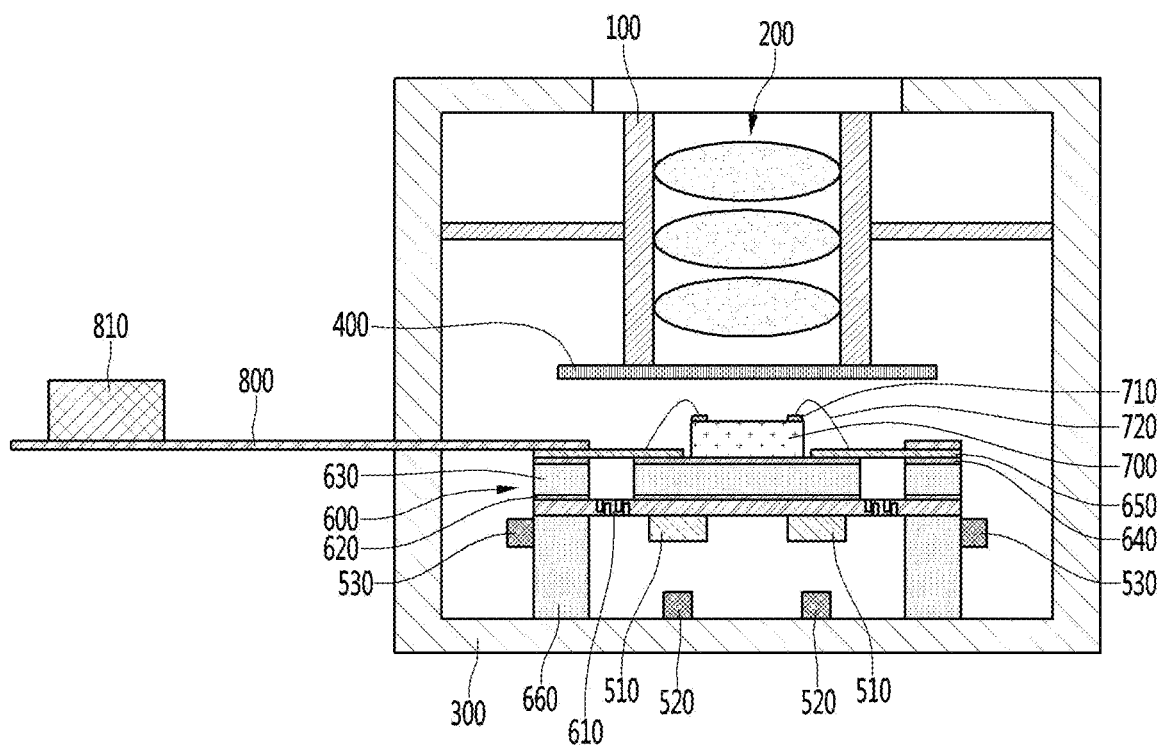
FIG. 2 is a view showing a camera device according to a first embodiment.

FIG. 2 is a view showing a camera device according to the first embodiment.

Referring to FIG. 2, the camera device according to the first embodiment includes a lens barrel 100, a lens assembly 200, a housing 300, an infrared cut filter part 400, a driving part 510, 520, 530, and an image sensor substrate 600, an image sensor 700, and a flexible circuit board 800.

The lens barrel 100 accommodates the lens assembly 200.

The lens barrel 100 may include a receiving groove for accommodating the lens assembly 200. The receiving groove may have a shape corresponding to the lens assembly 200.

The lens barrel 100 may have a rectangular tube shape or a cylindrical shape. That is, the outer periphery of the lens barrel 100 may have a rectangular tube shape or a cylindrical shape, but the embodiment is not limited thereto.

The lens barrel 100 is connected to the housing 300. The lens barrel 100 is accommodated in the housing 300. The lens barrel 100 may be coupled to the housing 300 by a separate coupling member (not shown).

The lens barrel 100 may include an open region in an upper portion thereof. Preferably, the lens barrel 100 may include a light entrance groove that is open to an object side. The light entrance groove may expose the lens assembly 200. In addition, an image may be incident on the lens assembly 200 via the light entrance groove.

The lens assembly 200 is disposed in the lens barrel 100. The lens assembly 200 is accommodated in the accommodating groove provided in the lens barrel 100. The lens assembly 200 may be inserted into and fixed to the accommodating groove of the lens barrel 100. The lens assembly 200 may have a circular outer shape. For example, the lens assembly 200 may have a circular shape when viewed from a top side, but the embodiment is not limited thereto. That is, the lens assembly 200 may have a rectangular shape when viewed from the top side.

The lens assembly 200 includes a plurality of lenses. For example, the lens assembly 200 may include first to fourth lenses. The first to fourth lenses may be sequentially stacked. In addition, a spacer (not shown) may be interposed between the lenses. The spacer may space a distance between the lenses constant. In the above, the lens assembly 200 has been described as including four lenses, but the embodiment is not limited thereto. For example, the lens assembly 200 may include one to three lenses, or may include five or more lenses.

The housing 300 accommodates the lens barrel 100. The housing 300 fixes a position of the lens barrel 100 via a separate fixing member (not shown). That is, according to the comparative example, the lens barrel is coupled to be movable with respect to the housing. Unlike this, in an embodiment, the housing 300 may be firmly fixed via the fixing member such that the lens barrel 100 does not move in the housing 300. Accordingly, the position of the lens barrel 100 in the housing 300 is always fixed. Accordingly, in the embodiment, since the lens barrel 100 is always fixed at the same position, it is possible to solve a problem of distortion of an optical axis caused by warping of the lens barrel, etc., thereby improving reliability The housing 300 may be formed of plastic or metal. The housing 300 may have a rectangular tube shape.

The infrared cut-off filter part 400 may be disposed at a lower end of the lens barrel 100. The infrared cut-off filter part 400 may be fixedly disposed on a separate substrate (not shown), and accordingly, it may be coupled to the lens barrel 100. The infrared cut-off filter part 400 may block light having an excessive long wavelength flowing into the image sensor 700.

The infrared cut-off filter 400 may be formed by alternately depositing titanium oxide and silicon oxide on an optical glass. In this case, thicknesses of the titanium oxide and the silicon oxide constituting the infrared cut-off filter 400 may be appropriately adjusted in order to block infrared rays.

The driving parts 510, 520, and 530 move the image sensor substrate 600 relative to the fixed lens barrel 100. The driving parts 510, 520, and 530 move the image sensor substrate 600 relative to the fixed housing 300. The driving part 510, 520, and 530 move the image sensor substrate 600 relative to the fixed lens assembly 200.

To this end, the driving parts 510, 520, and 530 may move the image sensor substrate 600 relative to magnetic force. The driving parts 510, 520, and 530 may include a first driving part 510, a second driving part 520, and a third driving part 530.

The first driving part 510 is attached to the image sensor substrate 600. Preferably, the first driving part 510 may be attached to a lower surface of the image sensor substrate 600. More preferably, the first driving part 510 may be attached to a lower surface of the insulating layer 610 constituting the image sensor substrate 600. The first driving part 510 may include a magnet. For example, the first driving part 510 may include a permanent magnet. In this case, the magnet constituting the first driving part 510 may have a plate shape. Accordingly, the first driving part 510 may include an upper surface, a lower surface, and side surfaces.

The second driving part 520 may be disposed on a bottom surface of the housing 300. Preferably, the second driving part 520 may be disposed on the bottom surface of the housing 300 overlapped with the image sensor substrate 600 in a vertical direction. The second driving part 520 may include a coil. The second driving part 520 may receive a driving signal and generate a magnetic field according to the driving signal.

In this case, the first driving part 510 and the second driving part 520 may face each other. That is, the first driving part 510 and the second driving part 520 may be disposed to be overlapped with each other in the vertical direction. The first driving part 510 and the second driving part 520 may be disposed side by side in the horizontal direction. That is, the lower surface of the first driving part 510 and an upper surface of the second driving part 520 may be disposed to face each other. A separation distance between the first driving part 510 and the second driving part 520 may be 50 μm to about 1000 μm, but the embodiment is not limited thereto.

Magnetic force may be generated between the first driving part 510 and the second driving part 520. Accordingly, the image sensor substrate 600 may move in the X-axis direction and the Y-axis direction by repulsion force or attraction force generated between the second driving part 520 and the first driving part 510. In addition, the image sensor substrate 600 may be tilted (or rotated) according to a change in a direction of a current applied to the second driving part 520. To this end, the second driving part 520 and the first driving part 510 may each include a plurality of magnets and a plurality of coils.

The third driving part 530 may be attached to the image sensor substrate 600. Preferably, the third driving part 530 may be attached to a side wall of the image sensor substrate 600. In detail, the third driving part 530 may be attached to a side surface of the supporting layer 660 of the image sensor substrate 600. In this case, at least a portion of the third driving part 530 may be disposed to be overlapped with the first driving part 510 in the horizontal direction. The third driving part 530 may be disposed perpendicular to the first driving part 510. That is, an upper surface of the third driving part 530 may be disposed to face the side surface of the first driving part 510. Accordingly, the image sensor substrate 600 may move in the Z-axis direction by attraction force and repulsion force between the third driving part 530 and the first driving part 510.

The image sensor substrate 600 is a substrate on which the image sensor 700 is mounted. In detail, the image sensor substrate 600 may be driven by the driving parts 510, 520, and 530 to move the image sensor 700 in the X, Y, and Z-axis directions. In addition, the image sensor substrate 600 may be driven by the driving parts 510, 520, and 530 to tilt the image sensor 700.

The image sensor substrate 600 may be disposed to be spaced apart from the bottom surface of the housing 300 by a predetermined distance. In addition, the image sensor substrate 600 may move the mounted image sensor 700 relative to the housing 300.

To this end, the image sensor substrate 600 may include a spring plate 610, a first bonding sheet 620, an insulating layer 630, a second bonding sheet 640, a conductive pattern portion 650, and a supporting layer 660.

The spring plate 610 supports the insulating layer 630 and the conductive pattern portion 650 constituting the image sensor substrate 600. In addition, the spring plate 610 may move the image sensor 700 disposed on the image sensor substrate 600 in the X-axis, Y-axis and Z-axis directions. To this end, the spring plate 610 may include at least one elastic member. Preferably, the spring plate 610 may include a plurality of elastic members. For example, the spring plate 610 may include four elastic members.

The spring plate 610 may be formed of a metal material such as stainless steel (STS) or invar, but is not limited thereto. For example, the spring plate 610 may be formed of another metal material such as a spring material having elasticity in addition to the above material. That is, the spring plate 610 may have a certain elastic force. Accordingly, the spring plate 610 may elastically support the image sensor substrate 600 and move the image sensor substrate 600 in the X-axis, Y-axis and Z-axis directions.

An insulating layer 630 is disposed on the spring plate 610. In this case, a first bonding sheet 620 may be disposed between the spring plate 610 and the insulating layer 630. The first bonding sheet 620 may be disposed between the spring plate 610 and the insulating layer 630 to provide adhesion. That is, the first bonding sheet 620 may fix the insulating layer 630 on the spring plate 610. To this end, the first bonding sheet 620 may be formed of a double-sided adhesive film. The first bonding sheet 620 may be formed of an epoxy or acrylic adhesive.

An insulating layer 630 is disposed on the first bonding sheet 620. That is, the insulating layer 630 may be attached on the spring plate 610 by the first bonding sheet 620.

The insulating layer 630 is a substrate for forming the conductive pattern portion 650. The insulating layer 630 may include all of a printed circuit board, a wiring board, and an insulating substrate made of an insulating material capable of forming the conductive pattern portion 650 on the surface.

The insulating layers 610 may be rigid or flexible. For example, the insulating layer 610 may include glass or plastic. Specifically, the insulating layer 610 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

Further, the insulating layer 610 may include an optically isotropic film. For example, the insulating layer 610 may include cyclic olefin copolymer (COC), cyclic olefin polymer (COP), optically isotropic PC, optically isotropic polymethylmethacrylate (PMMA), etc.

In this case, the insulating layer 610 may be partially bent while having a curved surface. That is, the insulating layer 610 may partially have a plane and may partially be bent while having a curved surface. In addition, the insulating layer 610 may be a flexible substrate having flexibility. Further, the insulating layer 610 may be a curved or bended substrate.

A conductive pattern portion 650 is disposed on the insulating layer 630. The conductive pattern portion 650 may include a lead pattern part spaced apart from each other by a predetermined distance on the insulating layer 630. For example, the conductive pattern portion 650 may include a first lead pattern part connected to the image sensor 700 and a second lead pattern part connected to the flexible circuit board 800. In addition, the conductive pattern portion 650 may include an extension pattern part connecting the first lead pattern part and the second lead pattern part. The first lead pattern part, the second lead pattern part, and the extension pattern part will be described in detail below.

The conductive pattern part 650 is a wiring for transmitting an electrical signal, and may be formed of a metal material having high electrical conductivity. For this, the conductive pattern part 640 may be formed of at least one metal material selected from among gold (Au), silver (Ag), platinum (Pt), titanium (Ti), tin (Sn), copper (Cu), and zinc (Zn). In addition, the circuit pattern 112 may be formed of paste or solder paste including at least one metal material selected from among gold (Au), silver (Ag), platinum (Pt), titanium (Ti), tin (Sn), copper (Cu), and zinc (Zn), which are excellent in bonding strength.

Preferably, the conductive pattern part 650 serves as a wiring for transmitting an electrical signal, and may be formed of a metallic material having an elastic force movable in the X-axis, Y-axis, and Z-axis directions by interlocking with the elastic member of the siring plate 610. To this end, the conductive pattern part 650 may be formed of a metal material having a tensile strength of 1000 MPa or more. For example, the conductive pattern part 650 may be a binary alloy or ternary alloy containing copper. For example, the conductive pattern portion 650 may be a binary alloy of copper (Cu)-nickel (Ni). For example, the conductive pattern portion 650 may be a binary alloy of copper (Cu)-tin (Sn). For example, the conductive pattern part 640 may be a binary alloy of copper (Cu)-beryllium (Be). For example, the conductive pattern part 640 may be a binary alloy of copper (Cu)-cobalt (Co). For example, the conductive pattern portion 650 may be a ternary alloy of copper (Cu)-nickel (Ni)-tin (Sn). For example, the conductive pattern portion 650 may be a ternary alloy of copper (Cu)-beryllium (Be)-cobalt (Co). In addition, in addition to the metal material, the conductive pattern portion 650 may be formed of an alloy of iron (Fe), nickel (Ni), zinc (Zn), and the like having an elastic force capable of acting as a spring and having good electrical characteristics. Further, the conductive pattern portion 650 may be surface-treated with a plating layer containing a metal material such as gold (Au), silver (Ag), palladium (Pd), and the like, thereby improving electrical conductivity.

Meanwhile, the conductive pattern portion 650 may be formed by a general process of manufacturing a printed circuit board, such as an additive process, a subtractive process, a modified semi additive process (MSAP), a semi additive process (SAP), etc., and detailed descriptions thereof will be omitted herein.

The supporting layer 660 may be a supporting substrate. A third driving part 530 may be mounted on the supporting layer 660. Accordingly, an electric signal may be applied to the third driving part 530. The supporting layer 660 may support the spring plate 610. Preferably, the supporting layer 660 may support the spring plate 610, the first bonding sheet 620, the second bonding sheet 640, the insulating layer 630, the conductive pattern portion 650 and the image sensor 700 at a position floating from a bottom surface of the housing 300.

The image sensor 700 is disposed on the image sensor substrate 600. Preferably, the image sensor 700 is disposed on the conductive pattern portion 650 of the image sensor substrate 600. The image sensor 700 may be mounted on the first lead pattern part constituting the conductive pattern portion 650 of the image sensor substrate 600.

The image sensor 700 may be composed of a charge coupled device (CCD) or a complementary metal oxide semiconductor (CMOS) sensor, and may be a device that outputs a photographed object using a photoelectric conversion element and a charge coupled element as an electrical signal. The image sensor 700 may be electrically connected to the conductive pattern portion 650 on the image sensor substrate 600, and receive an image provided from the lens assembly 200. In addition, the image sensor 700 may convert the received image into an electrical signal and output the electrical signal. In this case, a signal output through the image sensor 700 may be transmitted to the flexible circuit board 800 via the conductive pattern portion 650.

One end of the flexible circuit board 800 may be connected to the image sensor substrate 600. The flexible circuit board 800 may receive an electrical signal output from the image sensor 700. The flexible circuit board 800 may have a connector at the other end. A main board (not shown) may be connected to the connector.

That is, the flexible circuit board 800 may connect the camera module and the main board of the external device. Specifically, the flexible circuit board 800 may connect between the conductive pattern portion 650 of the image sensor substrate 600 of the camera module and the main substrate of the portable terminal.

To this end, a region of the flexible circuit board 800 is disposed inside the housing 300, and accordingly, may be connected to the conductive pattern portion 650 of the image sensor substrate 600.

Hereinafter, the image sensor substrate 600 according to the first embodiment will be described in more detail.

Figure 3:
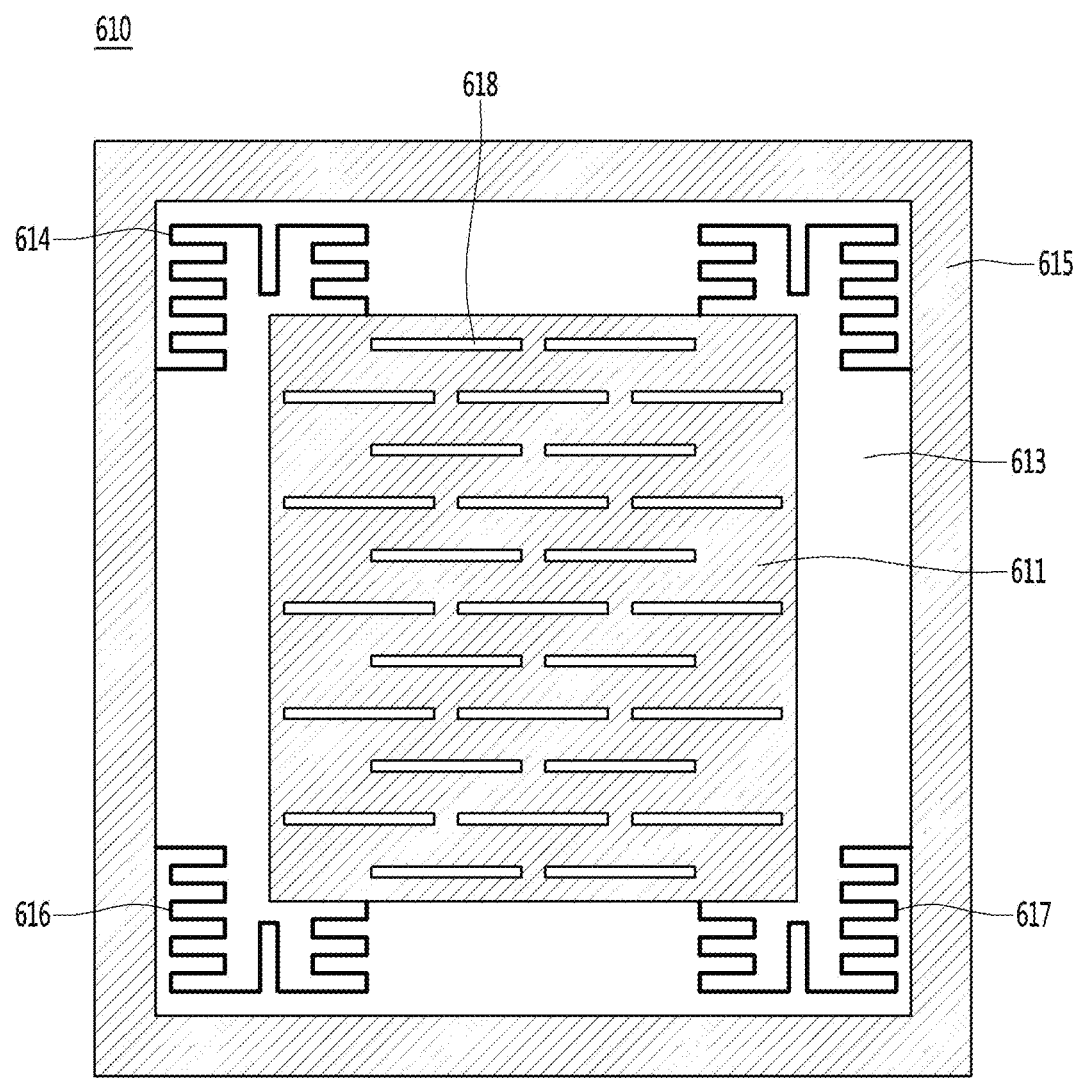
FIG. 3 is a view showing a spring plate shown in FIG. 2.

FIG. 3 is a view showing the spring plate shown in FIG. 2.

Referring to FIG. 3, the spring plate 610 may elastically support the insulating layer 630 and the conductive pattern portion 650 constituting the image sensor substrate 600.

The spring plate 610 may move the image sensor 700 disposed on the image sensor substrate 600 in the X-axis, Y-axis and Z-axis directions.

To this end, the spring plate 610 may be formed of a material having elasticity.

Specifically, the spring plate 610 may include a plurality of elastic members having elastic force. For example, the spring plate 610 may include four elastic members 614, 615, 616, and 617.

The spring plate 610 may be formed of a metal material such as stainless steel (STS) or invar, but the embodiment is not limited thereto. For example, the spring plate 610 may be formed of another metal material of a spring material having elastic force in addition to the material. That is, the spring plate 660 may have a predetermined elastic force, and accordingly, the spring plate 610 may move the image sensor substrate 600 in the X-axis, Y-axis, and Z-axis directions while elastically supporting the image sensor substrate 600.

The spring plate 610 may include a first plate part 611, a second plate part 612, and elastic members 614, 615, 616, and 617.

Specifically, the spring plate 610 may have a first plate part 611 disposed at the center thereof. In addition, the second plate part 612 may be disposed surrounding the first plate part 611 at a position spaced apart from the first plate part 611 by a predetermined distance.

That is, the spring plate 610 may include the first plate part 611 and the second plate part 612. And, an open region 613 is formed between the first plate part 611 and the second plate part 612. Preferably, the first plate part 611 and the second plate part 612 may be separated from each other.

The elastic members 614, 615, 616, and 617 may have one end connected to the first plate part 611 and the other end connected to the second plate part 612. To this end, the elastic members 614, 615, 616, 617 may include a first elastic member 614, a second elastic member 615, a third elastic member 616, and a fourth elastic member 617.

The first elastic member 614 may connect a first corner region of the first plate part 611 and a first corner region of the second plate part 612. The first elastic member 614 has one end connected to the first corner region of the first plate part 611 and the other end connected to the first corner region of the second plate part 612. And, the first elastic member 614 may elastically connect them. The first corner region may be a corner portion located at an upper left of each plate.

The second elastic member 615 may connect a second corner region of the first plate part 611 and a second corner region of the second plate part 612. The second elastic member 615 has one end connected to the second corner region of the first plate part 611 and the other end connected to the second corner region of the second plate part 612. And, the second elastic member 615 may elastically connect them. The second corner region may be a corner portion located at an upper right of each plate.

The third elastic member 616 may connect a third corner region of the first plate part 611 and a third corner region of the second plate part 612. The third elastic member 616 has one end connected to the third corner region of the first plate part 611 and the other end connected to the third corner region of the second plate part 612. And, the third elastic member 616 may elastically connect them. The third corner region may be a corner portion located at the lower left of each plate.

The fourth elastic member 617 may connect a fourth corner region of the first plate part 611 and a fourth corner region of the second plate part 612. The fourth elastic member 617 has one end connected to the fourth corner region of the first plate part 611 and the other end connected to the fourth corner region of the second plate part 612. And, the fourth elastic member 617 may elastically connect them. The fourth corner region may be a corner portion located at the lower right of each plate.

Meanwhile, in the drawings, each of the first plate part 611, the second plate part 612, and the elastic members 614, 615, 616, and 617 is illustrated as being configured separately, but is not limited thereto. That is, the first plate part 611, the second plate part 612, and the elastic members 614, 615, 616, and 617 may be integrally formed with each other. That is, the spring plate 610 may form an open region 613 on the plate of the plate-like member in the remaining portions except for portions corresponding to the elastic members 614, 615, 616, and 617.

Such the spring plate 610 may have a thickness of 10 μm to 100 μm. For example, the spring plate 610 may have a thickness of 20 μm to 70 μm. For example, the spring plate 610 may have a thickness of 40 μm to 50 μm. When the thickness of the spring plate 660 exceeds 100 μm, a thickness of the image sensor substrate 600 may increase. In addition, when the thickness of the spring plate 610 is smaller than 10 μm, a stress generated during movement of the image sensor substrate 600 may not be sufficiently maintained. Preferably, the spring plate 610 is set to have a thickness of 50 μm±10 μm to maintain a stress of 600 MPa or more.

In addition, the elastic members 614, 615, 616, and 617 have a length equal to or greater than a predetermined level. When the length of the elastic members 614, 615, 616, and 617 is too long, there is a problem that a volume of the spring plate 610 becomes large, and when the length of the elastic members 614, 615, 616, and 617 is too short, it may not be possible to stably and elastically support the image sensor substrate 600. Therefore, the elastic members 614, 615, 616, and 617 have a length of 50 μm to 100 μm. At this time, the length of the elastic members 614, 615, 616, and 617 is larger than the width of the open region 613. That is, the elastic members 614, 615, 616, and 617 may be formed to have a shape of a plurality of bent springs in the open region 613.

In addition, a plurality of slits 618 are formed in the first plate part 611. The plurality of slits 618 may be spaced apart from each other by a predetermined distance on the first plate part 61. The plurality of slits 618 may be formed for reducing a weight of the spring plate 610. In addition, the plurality of slits 618 may be formed for flatness of the spring plate 610. That is, the insulating layer 630, the conductive pattern portion 650, and the image sensor 700 are disposed on the first plate part 611. The first driving part is disposed below the first plate part 611. In this case, flatness of the first driving part or the image sensor 700 directly affects the reliability of the camera module, and the image quality may be deteriorated as the flatness is worsen. Therefore, in the embodiment, not only the weight of the spring plate 610 may be reduced but also the flatness may be maintained by forming the plurality of slits 618 in the first plate part 611, thereby improving overall reliability of the camera module.

Figure 4:
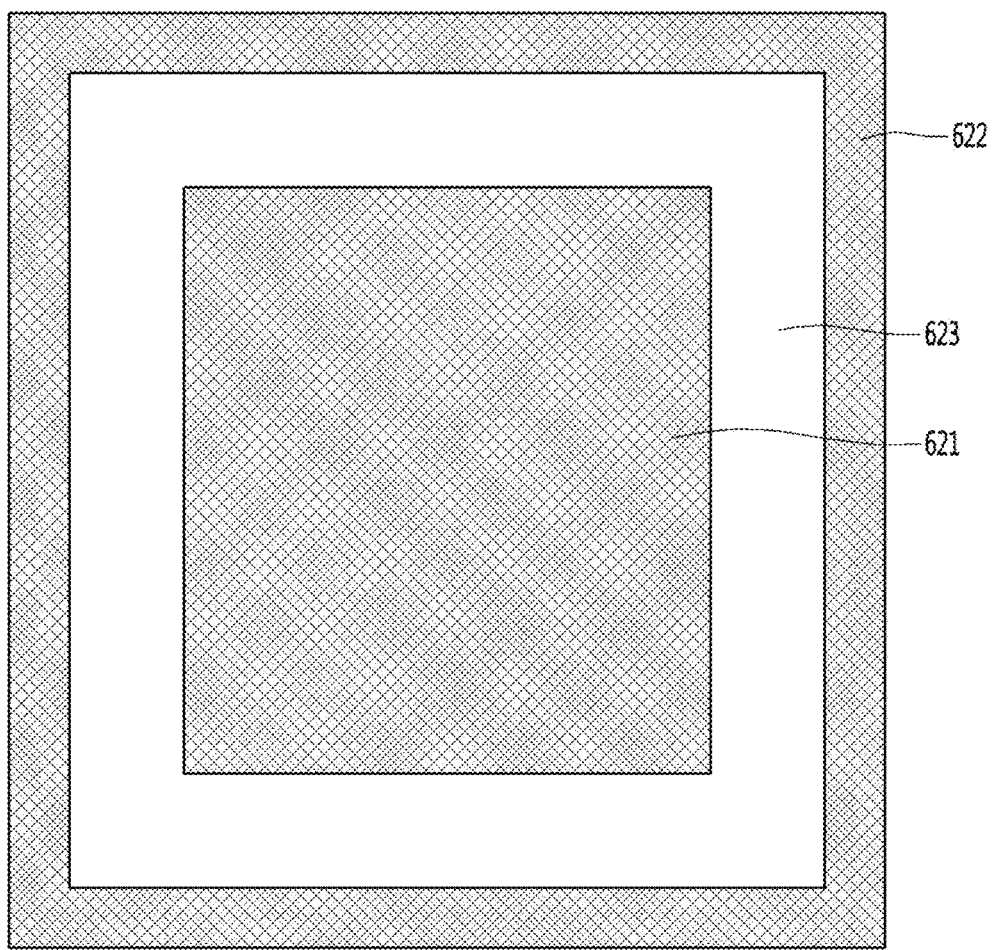
FIG. 4 is a view showing first and second bonding sheets shown in FIG. 2.

FIG. 4 is a view showing first and second bonding sheets shown in FIG. 2.

Referring to FIG. 4, a first bonding sheet 620 is disposed on the spring plate 610. In this case, the first bonding sheet 620 has a planar shape corresponding to the planar shape of the spring plate 610.

That is, the first bonding sheet 620 includes a first bonding part 621 disposed on the first plate part 611 of the spring plate 610 and a second bonding part 622 disposed on the second plate part 612 of the spring plate 610. In addition, the first bonding sheet 620 may include an open region 623 between the first bonding part 621 and the second bonding part 622.

The second bonding part 622 is disposed surrounding the first bonding part 621 at a position spaced apart from the first bonding part 621 by a predetermined distance. In this case, the second bonding part 622 does not directly contact the first bonding part 621. Accordingly, the first bonding part 621 and the second bonding part 622 may be separated from each other through the open region 623.

Meanwhile, the open region 623 of the first bonding sheet 620 may overlap the open region 613 of the spring plate 610 in a vertical direction. Preferably, a planar area of the open region 623 of the first bonding sheet 620 may be the same as a planar area of the open region 613 of the spring plate 610. In addition, the first bonding sheet 620 does not overlap with the elastic members 614, 615, 616, 617 of the spring plate 610 in the vertical direction. Accordingly, the first plate part 611 and the second plate part 612 may be covered by the first bonding sheet 620, and the elastic members 614, 615, 616, and 617 may be exposed by the open area 623 of the first bonding sheet 620.

The first bonding sheet 620 may be formed of a double-sided adhesive film. The first bonding sheet 620 may be formed of an epoxy or acrylic adhesive or a thermosetting adhesive film.

The first bonding sheet 620 may have a thickness of 25 µm.

Figure 5:
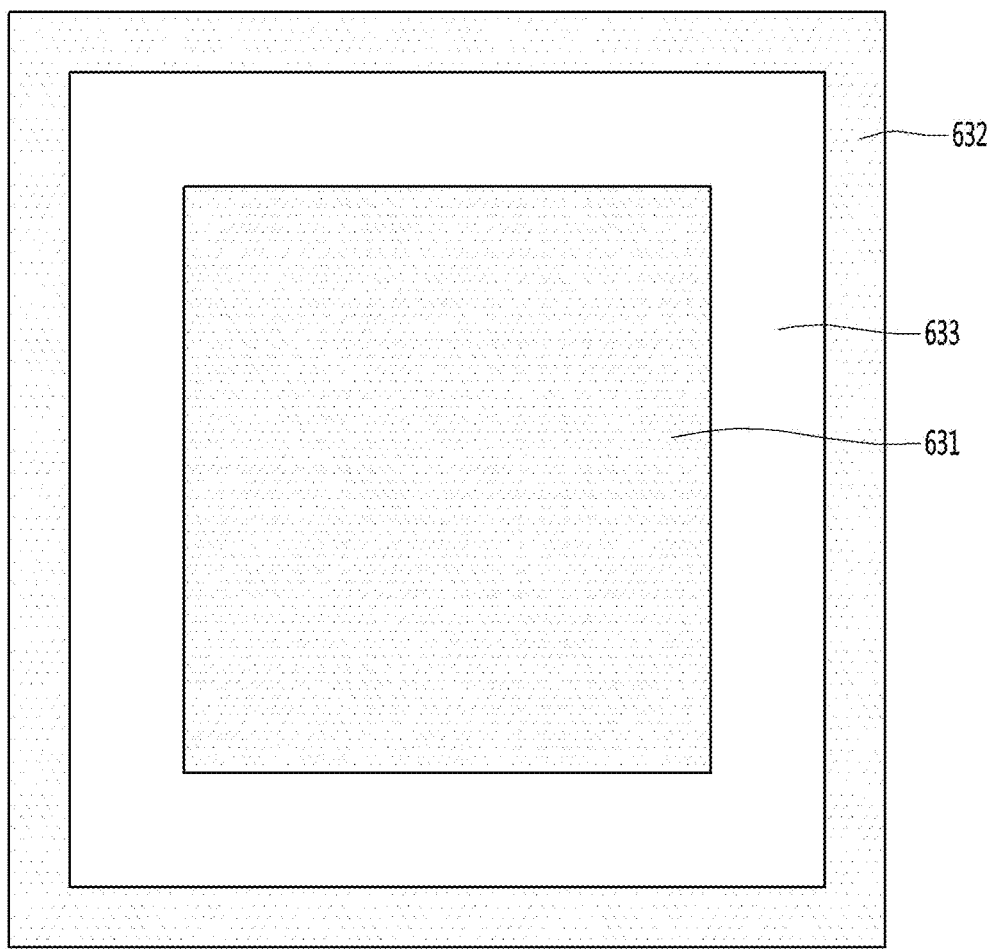
FIG. 5 is a view showing a first embodiment of the insulating layer shown in FIG. 2.
Figure 6:
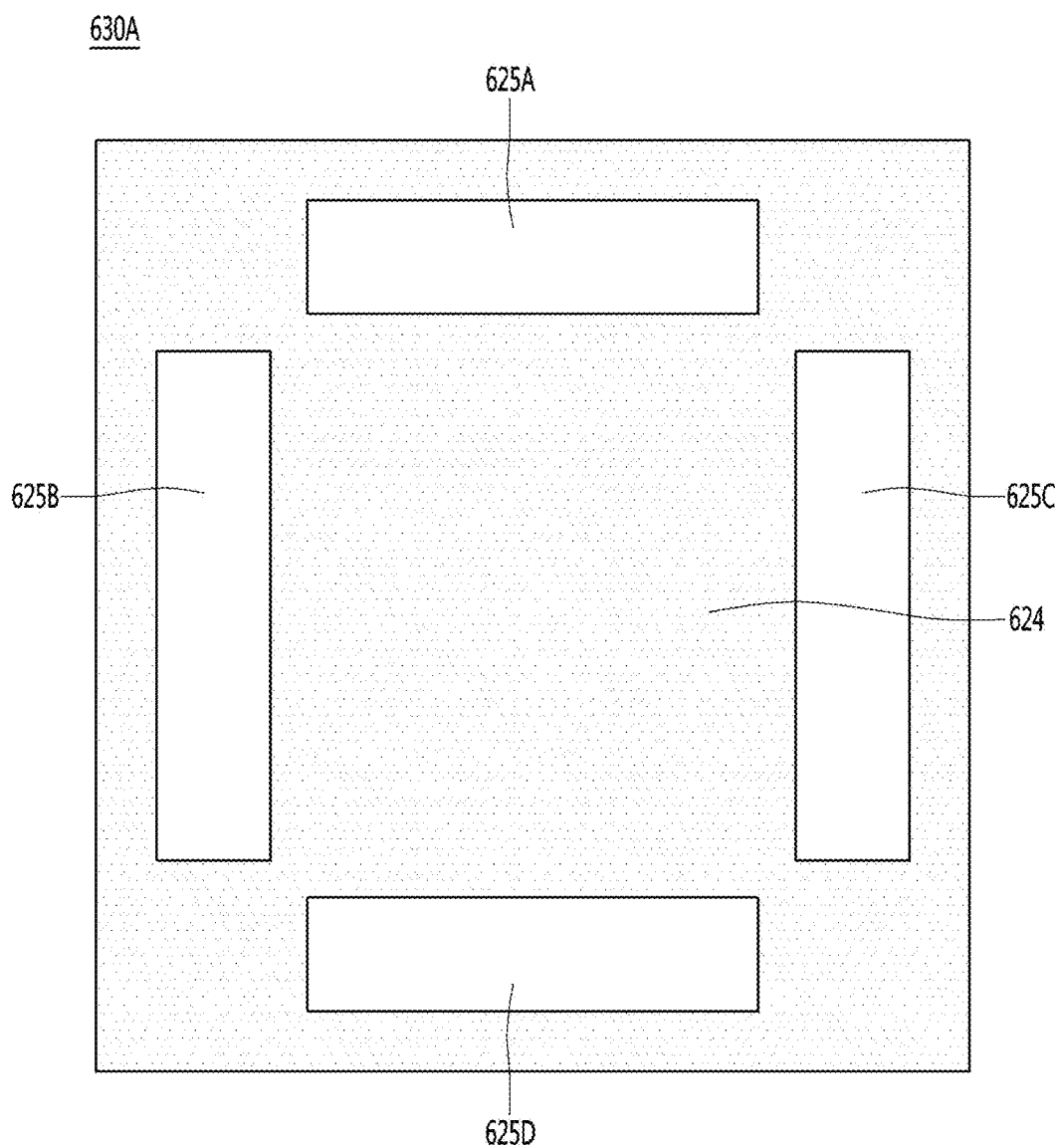
FIG. 6 is a view showing a second embodiment of the insulating layer shown in FIG. 2.
Figure 7:
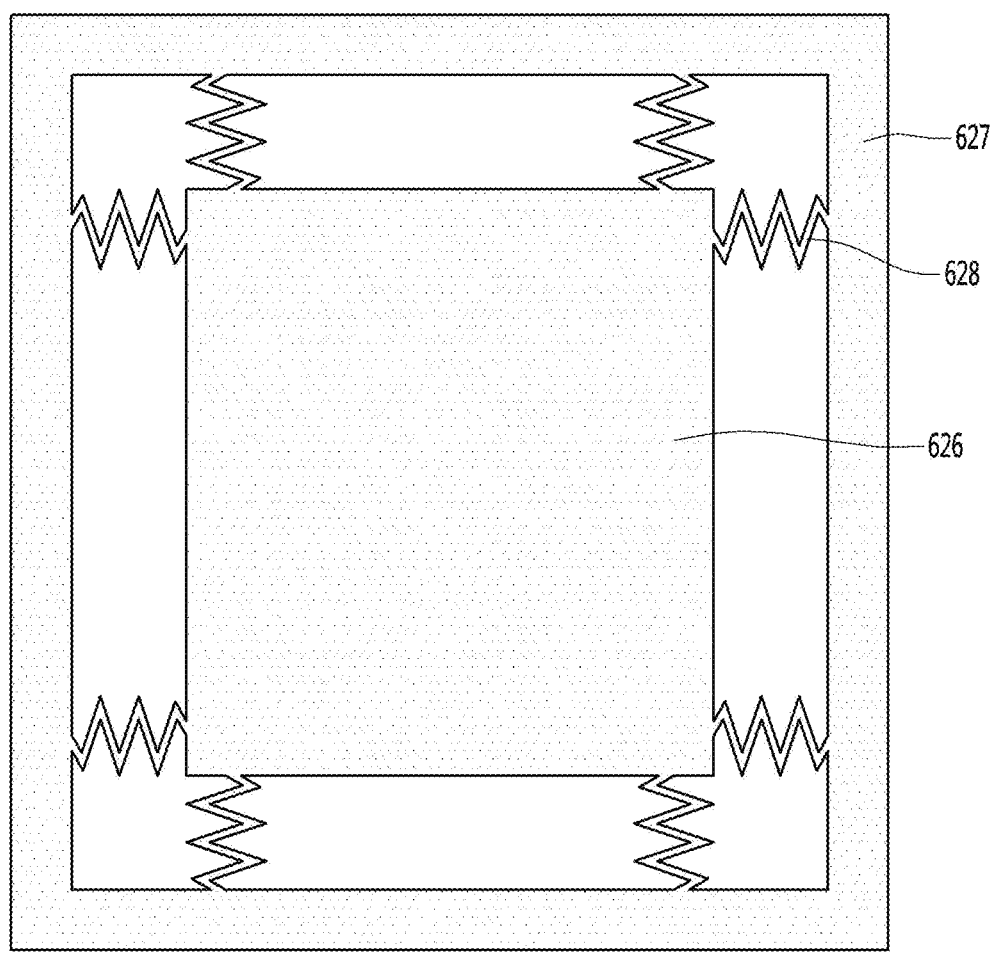
FIG. 7 is a view showing a third embodiment of the insulating layer shown in FIG. 2.

FIG. 5 is a view showing a first embodiment of the insulating layer shown in FIG. 2, FIG. 6 is a view showing a second embodiment of the insulating layer shown in FIG. 2, and FIG. 7 is a view showing a third embodiment of the insulating layer shown in FIG. 2.

Referring to FIG. 5, the insulating layer 630 is disposed on the first bonding sheet 620. The insulating layer 630 may have a planar shape corresponding to the planar shape of the first bonding sheet 620.

That is, the insulating layer 630 may include a first insulating part 631 disposed on the first bonding part 621 and a second insulating part 632 disposed on the second bonding part 622. In addition, the insulating layer 630 may include an open region 633 between the first insulating part 631 and the second insulating part 632.

The second insulating part 632 is disposed surrounding the first insulating part 631 at a position spaced apart from the first insulating part 631 by a predetermined distance. In this case, the second insulating part 632 does not directly contact the first insulating part 631. Accordingly, the first insulating part 631 and the second insulating part 632 may be separated from each other through the open region 633.

Meanwhile, the open region 633 of the insulating layer 630 may overlap the open region 613 of the spring plate 610 in a vertical direction. Preferably, a planar area of the open region 633 of the insulating layer 630 may be the same as the planar area of the open region 613 of the spring plate 610. In addition, the insulating layer 630 does not overlap with the elastic members 614, 615, 616, 617 of the spring plate 610 in the vertical direction. That is, the elastic members 614, 615, 616, and 617 may be exposed through the open region 623 of the first bonding sheet 620 and the open region 633 of the insulating layer 630.

The insulating layer 630 may have a thickness of 20 µm to 100 µm. For example, the insulating layer 630 may have a thickness of 25 µm to 50 µm. For example, the insulating layer 630 may have a thickness of 30 µm to 40 µm. When the thickness of the insulating layer 630 exceeds 100 µm, the overall thickness of the image sensor substrate 600 may increase. When the thickness of the insulating layer 630 is less than 20 µm, it may be difficult to dispose the image sensor 700. When the thickness of the insulating layer 630 is less than 20 µm, it may be weak against heat/pressure, or the like in a process of mounting the image sensor, and thus it may be difficult to mount the image sensor 700 stably.

Meanwhile, a second bonding sheet 640 is disposed on the insulating layer 630.

The second bonding sheet 640 has the same structure as the first bonding sheet 620. Compared to the first bonding sheet 620, the second bonding sheet 640 differs only in an arrangement position. Accordingly, a detailed description of the second bonding sheet 640 will be omitted. Meanwhile, although not shown in the drawing, the second bonding sheet 640 also includes an open area like the first bonding sheet 620 or the insulating layer 630, and accordingly, the elastic members 614, 615, 616, 617 is exposed.

Meanwhile, in the insulating layer 630 in the first embodiment, the first insulating part and the second insulating part are separated from each other. That is, the open region 633 of the insulating layer 630 is disposed to surround the entire circumference of the first insulating portion 631.

On the other hand, the open region 633 of the insulating layer 630 may be disposed partially surrounding the first insulating part 631.

FIG. 6, the insulating layer 630A in the second embodiment may include an insulating part 624 and a plurality of open holes 625A, 625B, 625C, and 625D disposed in the insulating part 624.

That is, in the first embodiment, the open region has a shape of one closed loop that is entirely disposed around the first insulating part. On the other hand, in the second embodiment, the plurality of open holes 625A, 625B, 625C, and 625D are disposed at positions spaced apart from each other by a predetermined interval. Accordingly, the insulating part 624 of the insulating layer 630A is not separated. In this case, the plurality of open holes 625A, 625B, 625C, and 625D may be formed on a region overlapping the open region 613 of the spring plate 610. At this time, a connection portion between the plurality of open holes 625A, 625B, 625C, 625D is positioned on a region overlapping in the vertical direction with the elastic members 614, 615, 616, 617 of the spring plate 610. According to this embodiment, the elastic support force of the image sensor substrate 600 may be improved by increasing the strength of the insulating layer 630A.

Also, referring to FIG. 7, the insulating layer 630B according to the third embodiment may include a first insulating part 626, a second insulating part 627, and an elastic insulating part 628.

The elastic insulating part 628 may be integrally formed with the first insulating part 626 and the second insulating part 627. That is, when an open region is formed in the insulating layer 630B, the entire periphery of the first insulating part 626 is not opened, that is, a spring-like pattern may remain around the first insulating part 626. Accordingly, the elastic insulating part 628 of the embodiment may be formed. The elastic insulating part 628 may be disposed on a region vertically overlapping the elastic members 614, 615, 616, 617 of the spring plate 610. According to such an embodiment, the elasticity of the image sensor substrate 600 may be improved by increasing the strength of the insulating layer 630B.

Figure 8:
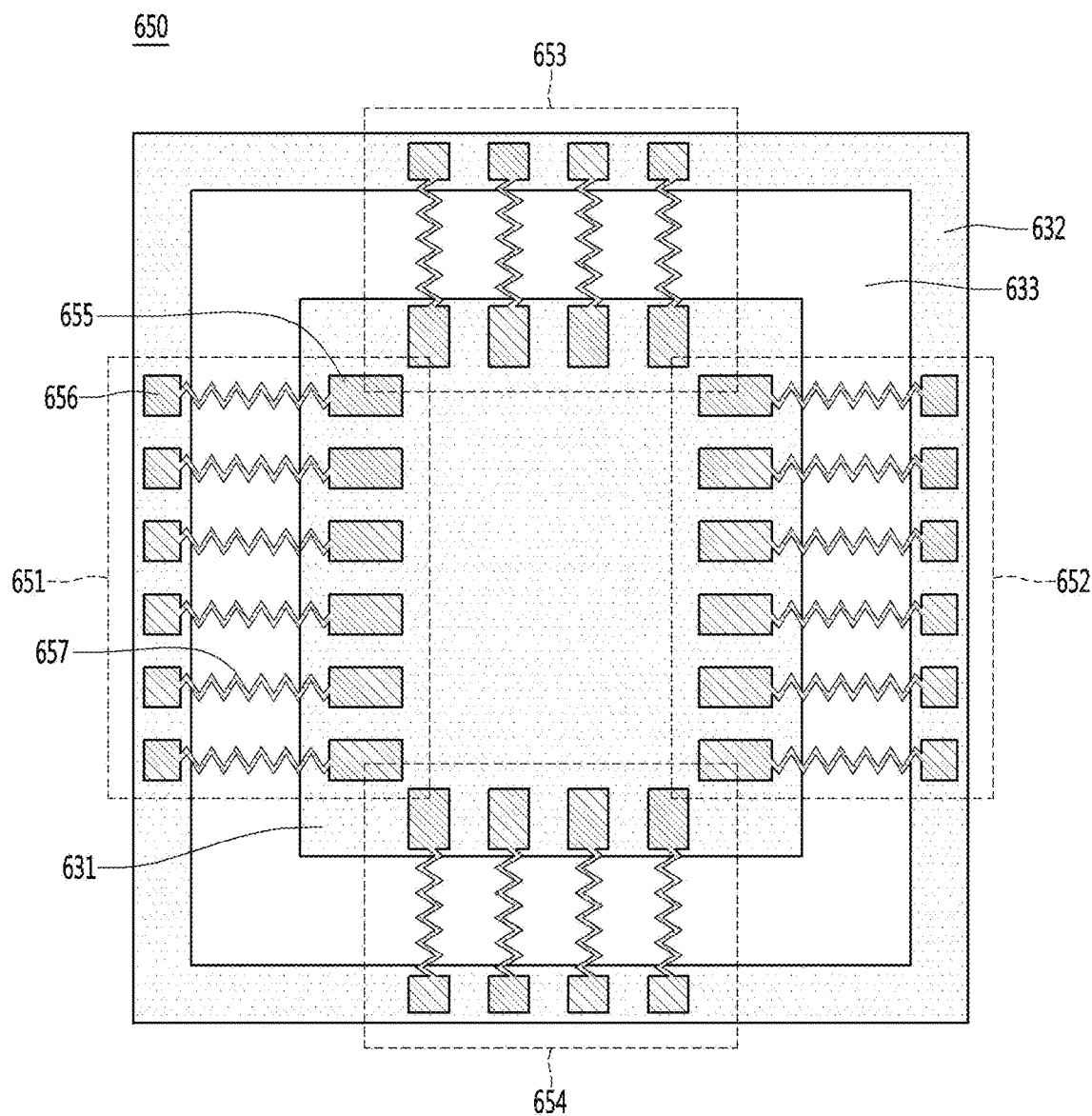
FIG. 8 is a view showing a pattern part shown in FIG. 2.

FIG. 8 is a view showing a pattern part shown in FIG. 2.

Referring to FIG. 8, the conductive pattern portion 650 may be disposed on the insulating layer 630 with a specific pattern. The conductive pattern portion 650 includes a first conductive pattern part 651 disposed on a first region of the insulating layer 630, a second conductive pattern part 652 disposed on a second region of the insulating layer 630, a third conductive pattern part 653 disposed on a third region of the insulating layer 630, and a fourth conductive pattern part 654 disposed on a fourth region of the insulating layer 630.

The first conductive pattern part 651 may be disposed on a left side of an upper surface of the insulating layer 630. That is, the first conductive pattern part 651 may be disposed on a left region of the first insulating part 631, a left region of the second insulating part 632, and a left region of the open region 633.

The second conductive pattern art 652 may be disposed in a right region of the upper surface of the insulating layer 630. That is, the second conductive pattern part 652 may be disposed on a right region of the first insulating part 631, a right region of the second insulating part 632, and a right region of the open region 633.

The third conductive pattern part 653 may be disposed in an upper region of the upper surface of the insulating layer 630. That is, the third conductive pattern part 653 may be disposed on an upper region of the first insulating part 631, an upper region of the second insulating part 632, and an upper region of the open region 633.

The fourth conductive pattern part 654 may be disposed in a lower region of the upper surface of the insulating layer 630. That is, the fourth conductive pattern part 654 may be disposed on a lower region of the first insulating part 631, a lower region of the second insulating part 632, and a lower region of the open region 633.

As described above, the conductive pattern portion 650 are disposed on different regions, and accordingly, the elastic support force in the movement of the image sensor substrate 600 may be increased. That is, when the conductive pattern portion 650 is intensively disposed only in a specific area, reliability in moving the image sensor substrate 600 in a specific direction may be reduced. For example, when the conductive pattern portion 650 includes only the first and second conductive pattern parts, there is no problem with the movement of the image sensor substrate 600 in the X-axis direction, stability may be deteriorated when the image sensor substrate 600 moves in the Y-axis direction. In addition, in this case, the conductive pattern portion 650 may be disconnected according to the periodic movement of the image sensor substrate 600. Accordingly, in the embodiment, the conductive pattern portion 650 is distributed in each of the four regions as described above, so that the image sensor substrate 600 can be stably moved in the X-axis, Y-axis, and Z-axis.

Meanwhile, the conductive pattern portion 650 may include a first lead pattern part 655 connected to the image sensor 700 and a second lead pattern part 656 connected to the flexible circuit board 800. In addition, the conductive pattern portion 650 may include an extension pattern part 657 connecting the first lead pattern part 655 and the second lead pattern part 656 to each other.

The first lead pattern part 655 is disposed on the first insulating part 631 of the insulating layer 630. The first lead pattern part 655 may be disposed in an outer region of the first insulating part 631. That is, the image sensor mounting area on which the image sensor 700 is mounted may be formed in the first insulating part 631. In this case, the image sensor mounting area may be a central area of the first insulating part 631. Accordingly, the first lead pattern part 655 may be disposed around the image sensor mounting area of the first insulating part 631.

The second lead pattern part 656 is disposed on the second insulating part 632 of the insulating layer 630. The second lead pattern parts 656 may be respectively disposed on the second insulating part 632. In this case, the first lead pattern part 655 and the second lead pattern part 656 may be disposed to face each other on the first insulating part 631 and the second insulating part 632. That is, the number of first lead pattern parts 655 may be the same as the number of second lead pattern parts 656. In addition, the first lead pattern parts 655 may be disposed to face the second lead pattern part 656, respectively.

Meanwhile, the extension pattern part 657 may be disposed between the first lead pattern part 655 and the second lead pattern part 656.

The extension pattern part 657 may have one end connected to the first lead pattern part 655 and the other end connected to the second lead pattern part 656 facing the first lead pattern part 655.

In this case, the extension pattern part 657 may be disposed on the open region of the insulating layer 630. Accordingly, the extension pattern part 657 may be disposed to float in the open region of the insulating layer, the open region of the first bonding sheet, the open region of the second bonding sheet, and the open region of the spring plate 610. Here, the meaning that the extension pattern part 657 is floating means that there is no support part supporting the extension pattern part 657 at the bottom. Accordingly, the extension pattern part 657 may be disposed in a state floating in the air.

A length of the extension pattern part 657 is greater than a linear distance between the first lead pattern part 655 and the second lead pattern part 656. That is, the extension pattern part 657 may be formed to have a structure that is bent a plurality of times between the first lead pattern part 655 and the second lead pattern part 656. Preferably, the extension pattern part 657 may be formed in a spring shape between the first lead pattern part 655 and the second lead pattern part 656.

At this time, the extension pattern part 657 may be formed by etching to have the above shape through an additive process, a subtractive process, a modified semi-additive process (MSAP), a semi-additive process (SAP), and the like. Preferably, the extension pattern part 657 may be formed simultaneously with the first lead pattern part 655 and the second lead pattern part 656. More preferably, the extension pattern part 657 may be integrally formed with the first lead pattern part 655 and the second lead pattern part 656.

Meanwhile, the thickness of the conductive pattern portion 650 including the extension pattern part 657, the first lead pattern part 655, and the second lead pattern part 656 may be 10 μm to 50 μm. For example, the thickness of the conductive pattern portion 650 may be 30 μm to 40 μm. In this case, when the thickness of the conductive pattern portion 650 is less than 10 μm, the conductive pattern portion 650 may be broken when the image sensor substrate 600 moves. In addition, when the thickness of the conductive pattern portion 650 is greater than 50 μm, elastic force of the extension pattern part 657 may be lowered, thereby hindering the mobility of the image sensor substrate 600. Accordingly, in the embodiment, the thickness of the conductive pattern portion 650 is set to be 35 μm±5 μm such that the image sensor substrate 600 may be stably moved.

In addition, the length of the extension pattern part 657 is set to have at least 1.5 times the linear distance between the first lead pattern part 655 and the second lead pattern part 656. In addition, the length of the extension pattern part 657 is set to be 20 times or less of the linear distance between the first lead pattern part 655 and the second lead pattern part 656. Preferably, the length of the extension pattern part 657 is set to be less than 4 times the linear distance between the first lead pattern part 655 and the second lead pattern part 656.

The linear distance between the first lead pattern part 655 and the second lead pattern part 656 may be 1.5 mm.

In this case, when the length of the extension pattern part 657 is smaller than 1.5 times the linear distance between the first lead pattern part 655 and the second lead pattern part, the mobility of the image sensor substrate 600 may be reduced due to the decrease in the elastic force of the extension pattern part 657. In addition, when the length of the extension pattern part 657 is greater than 20 times the linear distance, a resistance increases as a signal transmission distance is increased by the extension pattern part 657, and accordingly, noise may be included in a signal transmitted via the extension pattern part 657. Accordingly, in order to minimize noise generation, the length of the extension pattern part 657 is set to be 4 times or less the linear distance between the first lead pattern part 655 and the second lead pattern part 656.

In addition, the length of the extension pattern part 657 is smaller than the lengths of the elastic members 614, 615, 616, and 617.

Meanwhile, the conductive pattern portion 650 as described above is a wiring for transmitting an electrical signal, and may be formed of a metal material having high electrical conductivity. For this, the conductive pattern portion 650 may be formed of at least one metal material selected from among gold (Au), silver (Ag), platinum (Pt), titanium (Ti), tin (Sn), copper (Cu), and zinc (Zn). In addition, the conductive pattern portion 650 may be formed of paste or solder paste including at least one metal material selected from among gold (Au), silver (Ag), platinum (Pt), titanium (Ti), tin (Sn), copper (Cu), and zinc (Zn), which are excellent in bonding strength.

Preferably, the conductive pattern portion 650 serves as a wiring for transmitting an electrical signal, and may be formed of a metallic material having an elastic force movable in the X-axis, Y-axis, and Z-axis directions by interlocking with the elastic member. To this end, the conductive pattern portion 650 may be formed of a metal material having a tensile strength of 1000 MPa or more. For example, the conductive pattern portion 650 may be a binary alloy or ternary alloy containing copper. For example, the conductive pattern portion 650 may be a binary alloy of copper (Cu)-nickel (Ni). For example, the conductive pattern portion 650 may be a binary alloy of copper (Cu)-tin (Sn). For example, the conductive pattern portion 650 may be a binary alloy of copper (Cu)-beryllium (Be). For example, the conductive pattern portion 650 may be a binary alloy of copper (Cu)-cobalt (Co). For example, the conductive pattern portion 650 may be a ternary alloy of copper (Cu)-nickel (Ni)-tin (Sn). For example, the conductive pattern portion 650 may be a ternary alloy of copper (Cu)-beryllium (Be)-cobalt (Co). In addition, in addition to the metal material, the conductive pattern portion 650 may be formed of an alloy of iron (Fe), nickel (Ni), zinc (Zn), and the like having an elastic force capable of acting as a spring and having good electrical characteristics. Further, the conductive pattern portion 650 may be surface-treated with a plating layer containing a metal material such as gold (Au), silver (Ag), palladium (Pd), and the like, thereby improving electrical conductivity.

Figure 9:
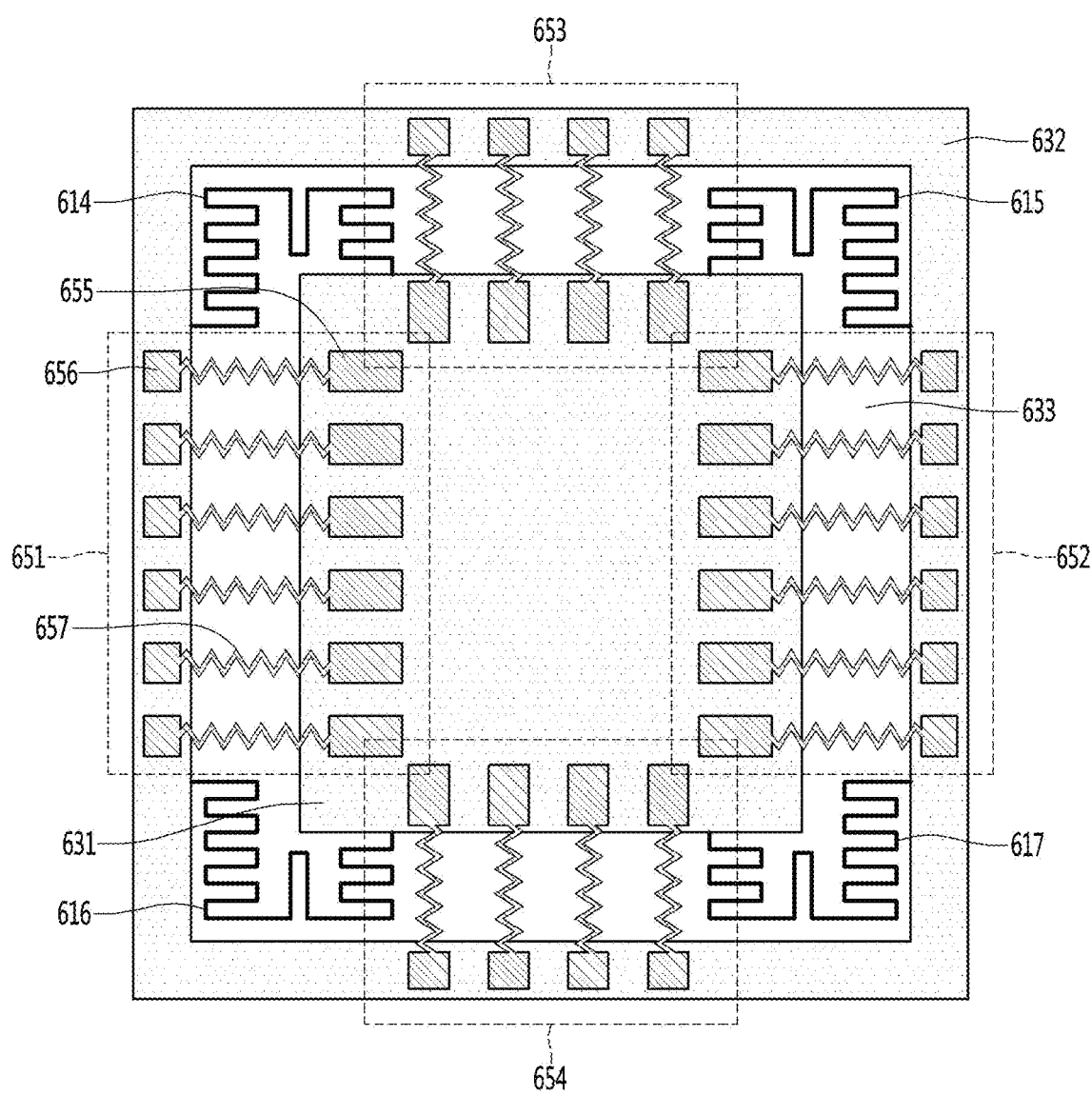
FIG. 9 is a plan view of a substrate for an image sensor according to the first embodiment.

FIG. 9 is a plan view of a substrate for an image sensor according to the first embodiment.

Referring to FIG. 9, the first bonding sheet 620 is disposed on the spring plate 610. In addition, the insulating layer 630 is disposed on the first bonding sheet 620. In addition, the second bonding sheet 630 is disposed on the insulating layer 630. In addition, the conductive pattern portion 650 is disposed on the second bonding sheet 630. In this case, the spring plate 610, the first bonding sheet 620, the insulating layer 630, and the second bonding sheet 630 each include an open region, and each of the open regions may overlap each other in a vertical direction. Therefore, the elastic members 614, 615, 616, 617 of the spring plate 610 disposed at a lowermost portion may be exposed through the open regions of the spring plate 610, the first bonding sheet 620, the insulating layer 630, and the second bonding sheet.

The extension pattern part 657 of the conductive pattern portion 650 is also disposed on the open region of the spring plate 610, the first bonding sheet 620, the insulating layer 630, and the second bonding sheet 630.

That is, the elastic members 614, 615, 616, 617 of the spring plate 610 and the extension pattern part 657 of the conductive pattern portion 650 are disposed in the open regions of the spring plate 610, the first bonding sheet 620, and the insulating layer 630, and the second bonding sheet 630.

In this case, the elastic members 614, 615, 616, 617 of the spring plate 610 and the extension pattern part 657 of the conductive pattern portion 650 do not overlap each other in the vertical direction. For example, the elastic members 614, 615, 616, 617 of the spring plate 610 are disposed in a first region of the open regions of the spring plate 610, the first bonding sheet 620, the insulating layer 630, the second bonding sheet 630. And, the extension pattern part 657 of the conductive pattern portion 650 is disposed in a second region of the open regions of the spring plate 610, the first bonding sheet 620, the insulating layer 630, and the second bonding sheet 630. The first region of the open regions may be a corner region of the open regions, and the second region of the open regions may be a remaining area except for the corner region.

That is, the image sensor substrate 600 not only moves in the X-axis direction and the Y-axis direction, but also moves in the Z-axis direction. At this time, there is a difference between the elastic modulus of the elastic members 614, 615, 616, and 617 and the elastic modulus of the extension pattern part 657. Accordingly, when the image sensor substrate 600 moves in the Z-axis direction, the movement distances of the elastic members 614, 615, 616, 617 and the extension pattern part 657 appear different from each other. Accordingly, when the image sensor substrate 600 moves in the Z-axis direction, the elastic members 614, 615, 616, 617 and the extension pattern part 657 may contact each other. Accordingly, a problem (for example, a short) may occur in electrical reliability. Accordingly, in the embodiment, as described above, the elastic members 614, 615, 616, 617 and the extension pattern part 657 are not aligned with each other in the vertical direction. Thereby, the electrical reliability problem can be solved.

Figure 10:
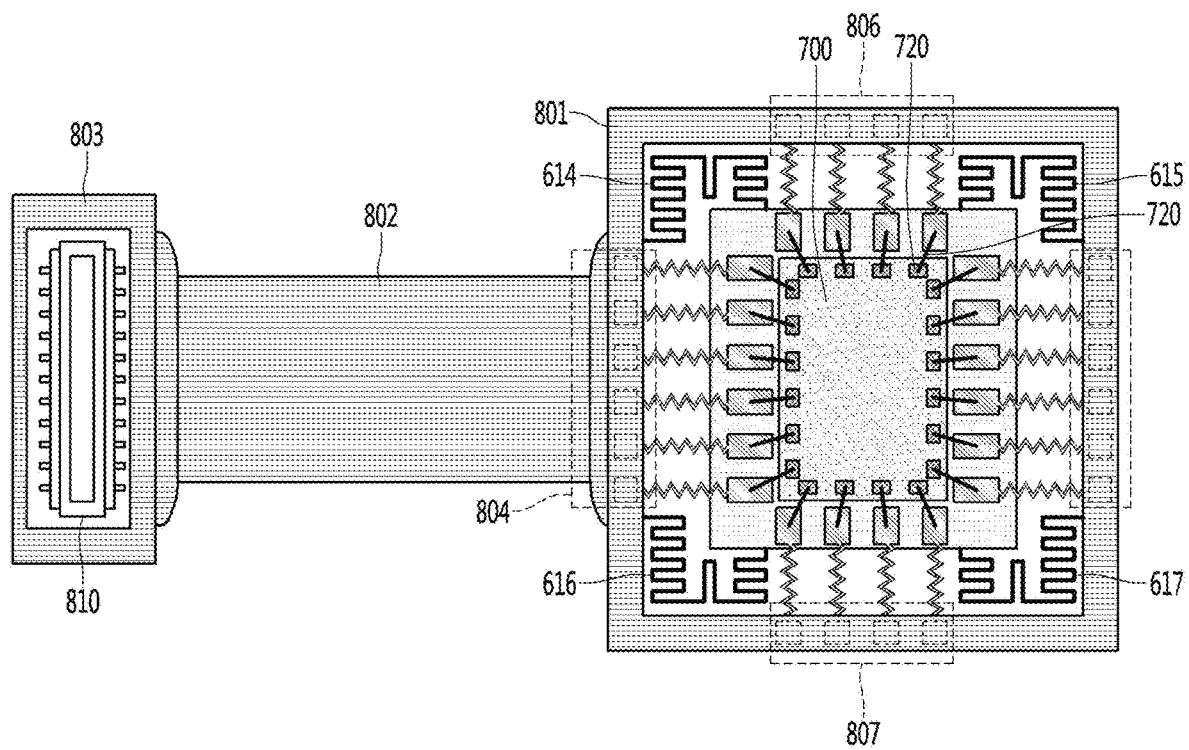
FIG. 10 is a view showing a connection structure between a flexible circuit board and an image sensor substrate according to the first embodiment.

FIG. 10 is a view showing a connection structure between a flexible circuit board and an image sensor board according to the first embodiment.

Referring to FIG. 10, the flexible circuit board 800 electrically connects the image sensor substrate 600 and an external main substrate (not shown) to each other.

One end of the flexible circuit board 800 may be connected to the image sensor substrate 600. The flexible circuit board 800 may receive an electrical signal output from the image sensor 700. The flexible circuit board 800 may have a connector 810 at the other end. A main board (not shown) may be connected to the connector 810.

That is, the flexible circuit board 800 may connect the camera module and the main board of the external device. Specifically, the flexible circuit board 800 may connect between the conductive pattern portion 650 of the image sensor substrate 600 of the camera module and the main board of a portable terminal.

To this end, an area of the flexible circuit board 800 is disposed inside the housing 300, and accordingly, may be connected to the conductive pattern portion 650 of the image sensor substrate 600.

That is, the flexible circuit board 800 may include a first connector part 801, a second connector part 803, and a connection part 802.

The first connector part 801 may be disposed inside the housing 300. The first connector part 801 may include a plurality of pads 804, 805, 806, and 807 connected to the conductive pattern portion 650.

The first connector part 801 may be electrically connected to the second lead pattern part 656 of the conductive pattern portion 650. That is, the plurality of pads 804, 805, 806, and 807 of the first connector part 801 may be electrically connected to the second lead pattern part 656.

To this end, the first connector part 801 may include a first pad part 804 connected to the second lead pattern part 656 of the first conductive pattern part 651. In addition, the first connector part 801 may include a second pad part 805 connected to the second lead pattern part 656 of the second conductive pattern part 652. In addition, the first connector part 801 may include a third pad part 806 connected to the second lead pattern part 656 of the third conductive pattern part 653. In addition, the first connector part 801 may include a fourth pad part 807 connected to the second lead pattern part 656 of the fourth conductive pattern part 654.

In this case, the first connector part 801 has a shape corresponding to the second insulating part 632 of the insulating layer 630. Accordingly, the first connector part 801 may be disposed surrounding an upper area of the second lead pattern part 656 of the conductive pattern portion 650, and the plurality of pads 804, 805, 806, and 807 may be disposed on a lower surface of the first connector part 801.

The connection part 802 connects the first connector part 801 and the second connector part 803 to each other. A part of the connection part 802 may be disposed in the housing 300, and may be extended therefrom to be exposed to the outside of the housing 300.

The second connector part 803 may include a connector 810 connected to the main board of the terminal.

Meanwhile, the image sensor 1700 may be attached on the first insulating part 1631 of the insulating layer 1610.

In this case, an electrode 710 of the image sensor 700 faces upward and may be attached to the first insulating part 631. In addition, a connection member 720 such as a metal wire is formed between the electrode 710 of the image sensor 700 and the first lead pattern part 655. The connection member 720 may electrically connect the electrode of the image sensor and the first lead pattern part.

Figure 11:
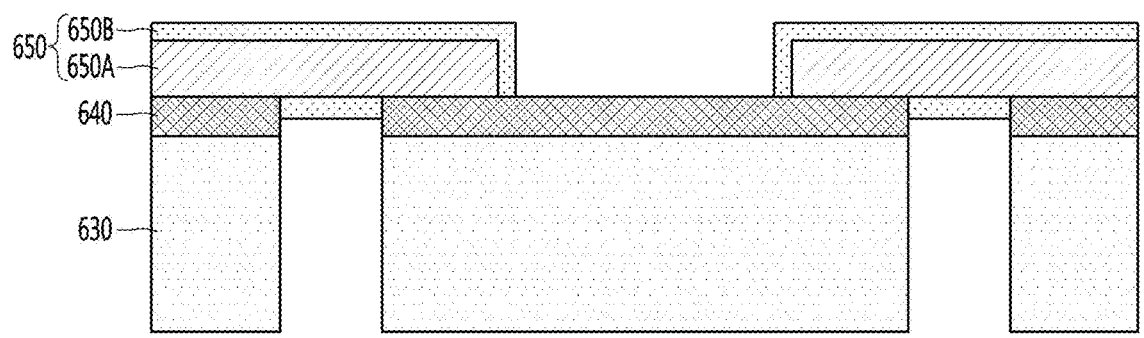
FIG. 11 is a view specifically showing a layer structure of a conductive pattern portion according to the first embodiment.

FIG. 11 is a diagram specifically illustrating a layer structure of a conductive pattern portion according to the first embodiment.

Referring to FIG. 11, the conductive pattern portion 650 is disposed on the second bonding sheet 640 disposed on the insulating layer 630. In this case, the conductive pattern portion 650 includes the first lead pattern part 655 disposed on the first insulating part 631 of the insulating layer 630, the second lead pattern part 656 on the second insulating part 632, and the extension pattern part 657 connecting therebetween.

In this case, each of the first lead pattern part 655, the second lead pattern part 656, and the extension pattern part 657 may include a metal layer 650A and a plating layer 650B.

The metal layer 650A may be disposed on the second bonding sheet 640. That is, the metal layer 650A is disposed on the second bonding sheet 640 to configure the first lead pattern part 655, the second lead pattern part 656, and the extension pattern part 657, respectively.

The plating layer 650B may be disposed on the metal layer 650A. Preferably, the plating layer 650B may be a surface treatment layer disposed on the metal layer 650A.

The plating layer 650B includes any one of Ni/Au alloy, gold (Au), electroless nickel immersion gold (ENIG), Ni/Pd alloy, and organic compound plating (Organic Solderability Preservative, OSP).

In this case, the plating layers 650B constituting the first lead pattern part 655 and the second lead pattern part 656 may correspond to each other. Alternatively, the plating layer 650B constituting the extension pattern part 657 may have a thickness different from that of the plated layer 650B constituting the first lead pattern part 655 and the second lead pattern part 656.

That is, the plating layer 650B of the first lead pattern part 655 and the second lead pattern part 656 may be selectively formed only on upper and side surfaces of the corresponding metal layer 650A. In contrast, the metal layer 650A constituting the extension pattern part 657 is disposed in a floating state on the above-described open region. Accordingly, the plating layer 650B of the extension pattern part 657 may be formed to surround the entire surface of the corresponding metal layer 650A. That is, the plating layer 650B of the extension pattern part 657 may be formed to surround the upper, side, and lower surfaces of the metal layer 650A of the extension pattern part 657.

Accordingly, the lower surface of the first lead pattern part 655 and the upper surface of the spring plate 610 may be spaced apart by a first distance. In addition, the lower surface of the second lead pattern part 656 and the upper surface of the spring plate 610 may be spaced apart by the first distance. In addition, the lower surface of the extension pattern part 657 and the spring plate 610 may be spaced apart by a second distance smaller than the first distance due to the plating layer.

Meanwhile, the thickness of the plating layer 650B may be 0.3 μm to 1 μm. For example, the thickness of the plating layer 650B may be 0.3 μm to 0.7 μm. The thickness of the plating layer 650B may be 0.3 μm to 0.5 μm.

Figure 12:
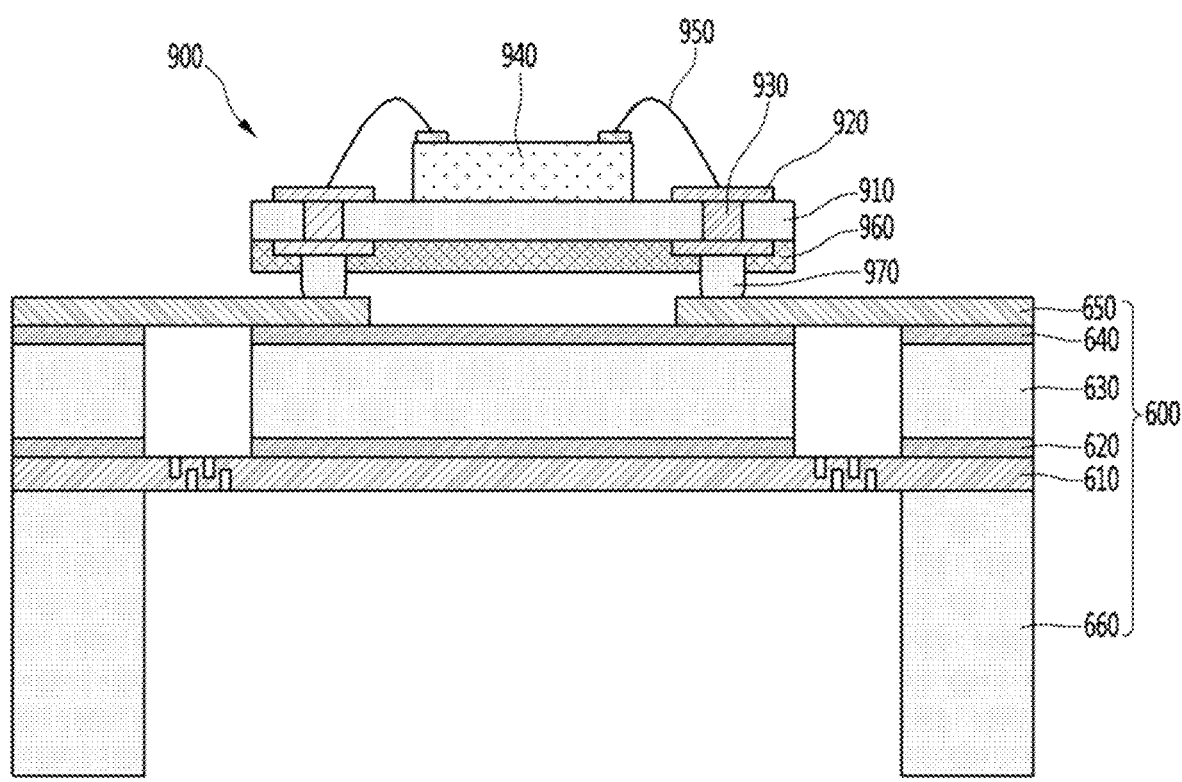
FIG. 12 is a view showing a modified example of the camera module.

FIG. 12 is a diagram showing a modified example of the camera module.

Referring to FIG. 12, the image sensor may be attached to the image sensor substrate 600 in a flip chip bonding method.

That is, after the image sensor in the previous embodiment is attached on the insulating layer 630, the first lead pattern part 655 and the electrode 710 of the image sensor 700 are mutually connected by wire bonding through a connection member.

Alternatively, the image sensor may be mounted on the package substrate, and accordingly, the image sensor may be mounted on the image sensor substrate 600 on the insulating layer 630 in a flip chip bonding method.

The package substrate 900 may include an insulating layer 910, a circuit pattern 920, a via 930, an image sensor 940, a connection member 950, a protection member 960, and an adhesive member 970.

The image sensor 940 may be electrically connected to the circuit patterns 920 respectively disposed on the upper and lower surfaces of the insulating layer 910 through the connection member 950. Further, the via 930 may electrically connect the circuit patterns 920 disposed on the upper and lower surfaces of the insulating layer 910 to each other.

The protection member 960 may be disposed on the lower surface of the insulating layer 910 to protect the lower surface of the insulating layer 910 and expose at least a part of the circuit pattern 920. In addition, an adhesive member 970 may be disposed on the circuit pattern exposed through the protection member 960. The adhesive member 970 may be a solder ball. The adhesive member 970 may contain materials of heterogeneous components in solder. The solder may be composed of at least one of SnCu, SnPb, and SnAgCu. In addition, the material of the heterogeneous component may include any one of Al, Sb, Bi, Cu, Ni, In, Pb, Ag, Sn, Zn, Ga, Cd, and Fe.

Meanwhile, in a state in which the package substrate 900 as described above is manufactured, the adhesive member 970 may be connected to the first lead pattern part 655.

Figure 13:
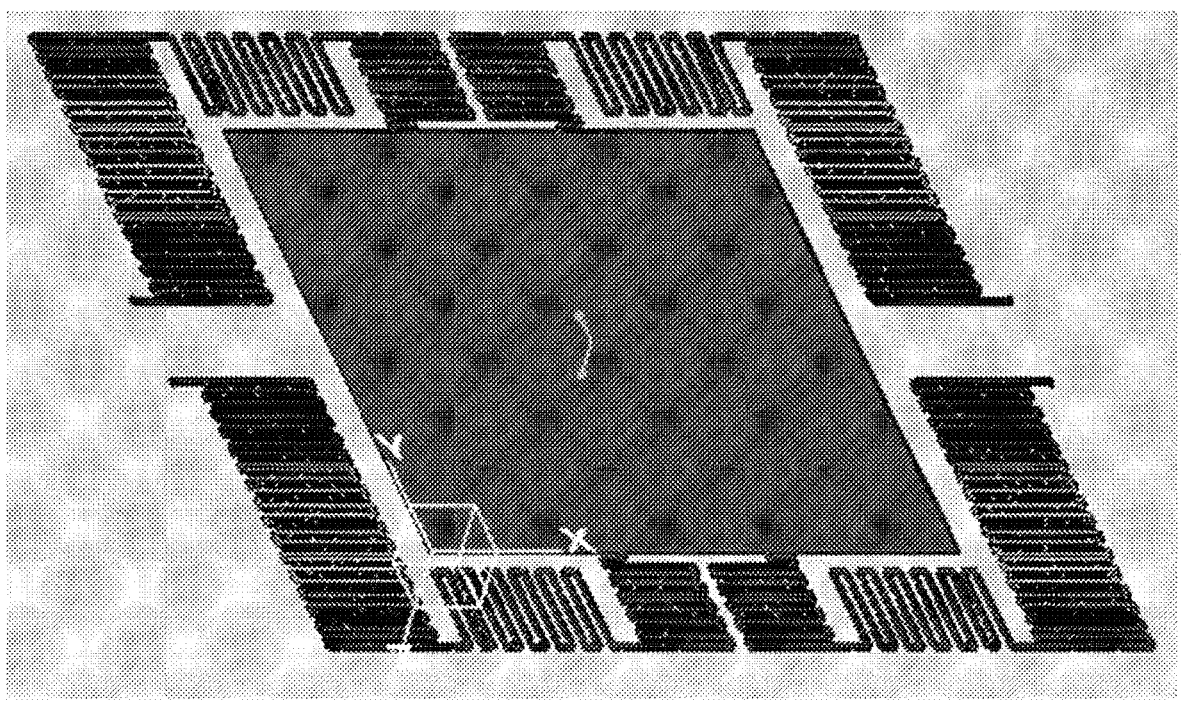
FIG. 13 is a view showing a X-axis displacement simulation of a spring plate according to the first embodiment.
Figure 14:
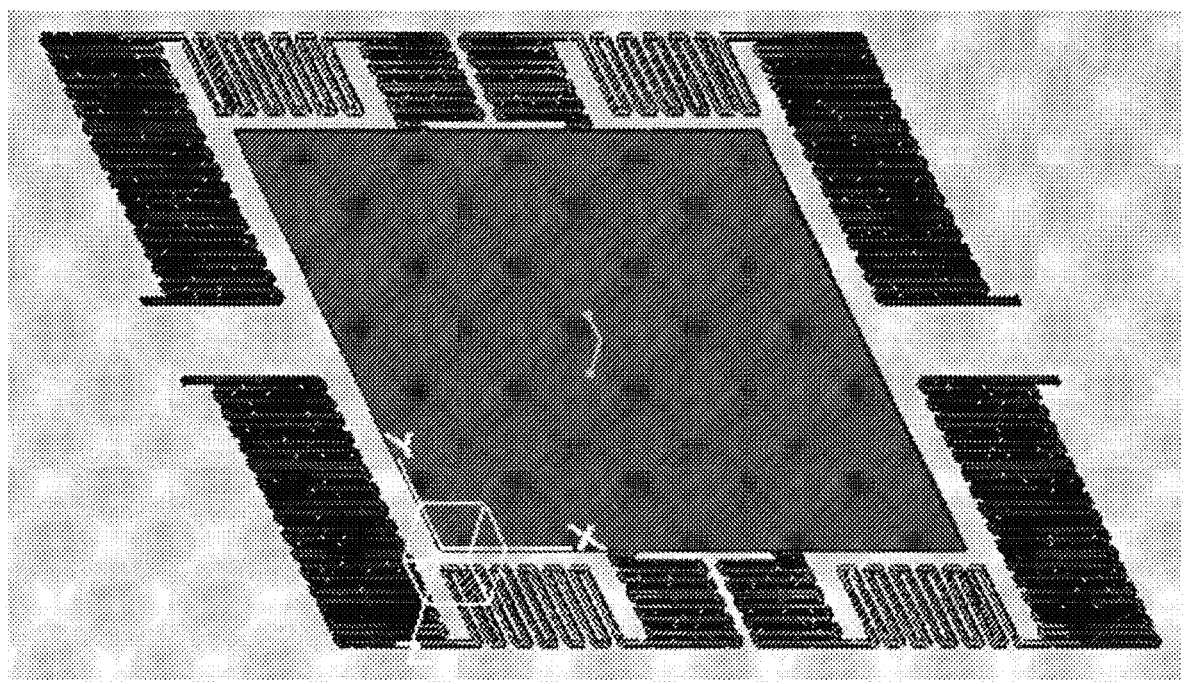
FIG. 14 is a view showing a Y-axis displacement simulation of a spring plate according to the first embodiment.
Figure 15:
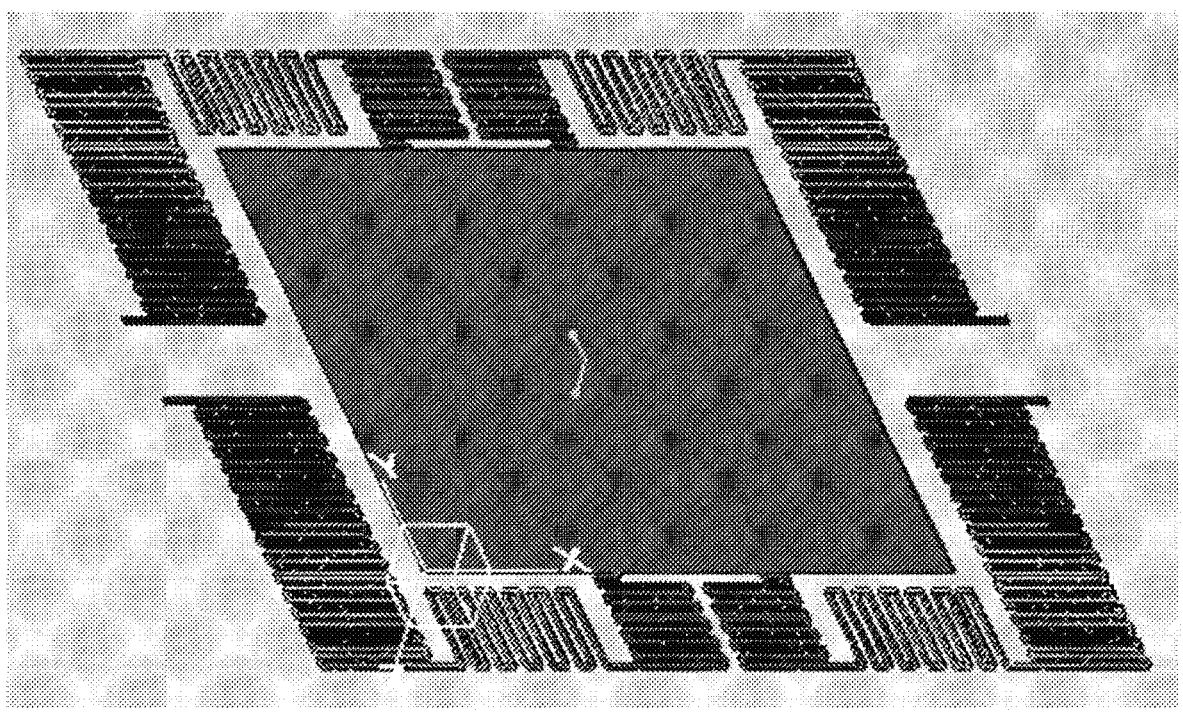
FIG. 15 is a view showing a Z-axis displacement simulation of a spring plate according to the first embodiment.
Figure 16:
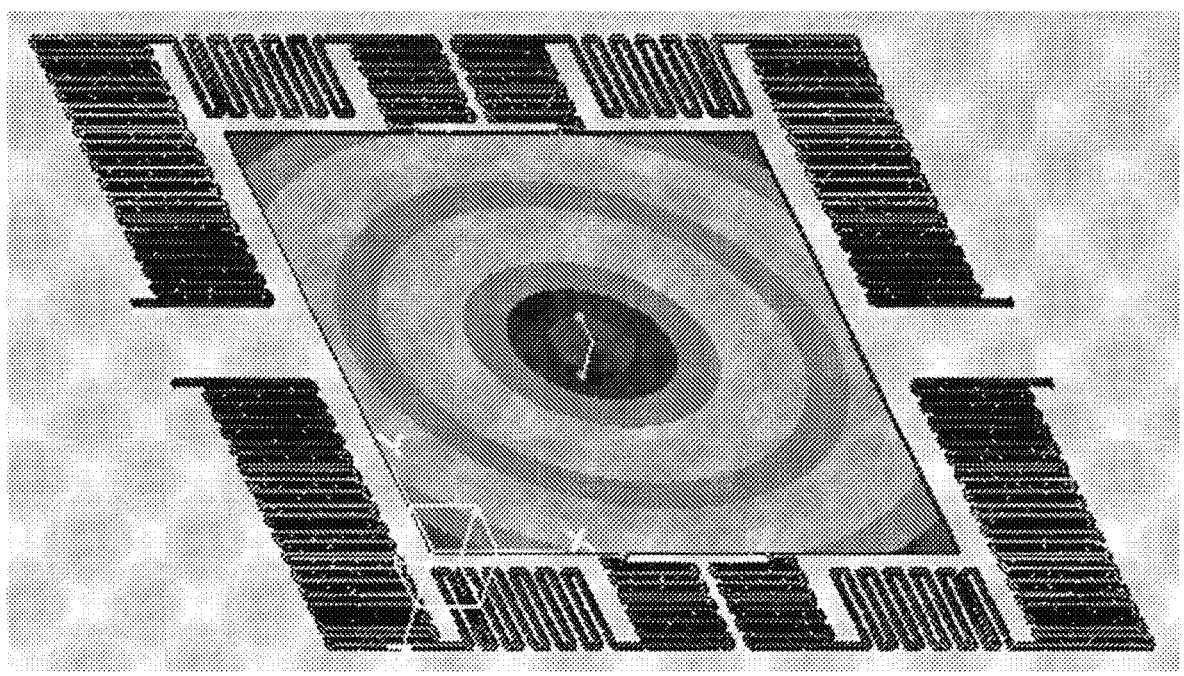
FIG. 16 is a view showing a tilt axis displacement simulation of a spring plate according to the first embodiment.

FIG. 13 is a view showing a X-axis displacement simulation of a spring plate according to the first embodiment, FIG. 14 is a view showing a Y-axis displacement simulation of a spring plate according to the first embodiment, FIG. 15 is a view showing a Z-axis displacement simulation of a spring plate according to the first embodiment, and FIG. 16 is a view showing a tilt axis displacement simulation of a spring plate according to the first embodiment.

Referring to FIGS. 13 and 16, reliability in the X-axis, Y-axis, Z-axis and tilt operation of the image sensor substrate 600 was evaluated by the spring plate 610 according to the embodiment. As a result of this, it was confirmed that the image sensor substrate 600 was stably supported for all movement directions, and it was confirmed that sufficient stress was maintained.

The results of the X-axis displacement simulation according to the embodiment are shown in Table 1.

TABLE 1

| condition | data | unit |
|---|---|---|
| Force | 10 | mN |
| displacement | 3.23 | mm |
| stress | 409 | MPa |
| spring constant | 3.10 | mM/mm |

The results of the Y-axis displacement simulation according to the embodiment are shown in Table 2.

TABLE 2

| condition | data | unit |
|---|---|---|
| Force | 10 | mN |
| displacement | 3.81 | mm |
| stress | 439 | MPa |
| spring constant | 2.62 | mM/mm |

The results of the Z-axis displacement simulation according to an embodiment are shown in Table 3.

TABLE 3

| condition | data | unit |
|---|---|---|
| Force | 10 | mN |
| displacement | 12.12 | mm |
| stress | 663 | MPa |
| spring constant | 0.83 | mM/mm |

The tilt displacement simulation results according to the embodiment are shown in Table 4 below.

TABLE 4

| condition | data | unit |
|---|---|---|
| Force | 5*2 (장 축) | mN |
| displacement | 22.4 (1.26) | ° (mm) |
| stress | 237 | MPa |

Figure 17:
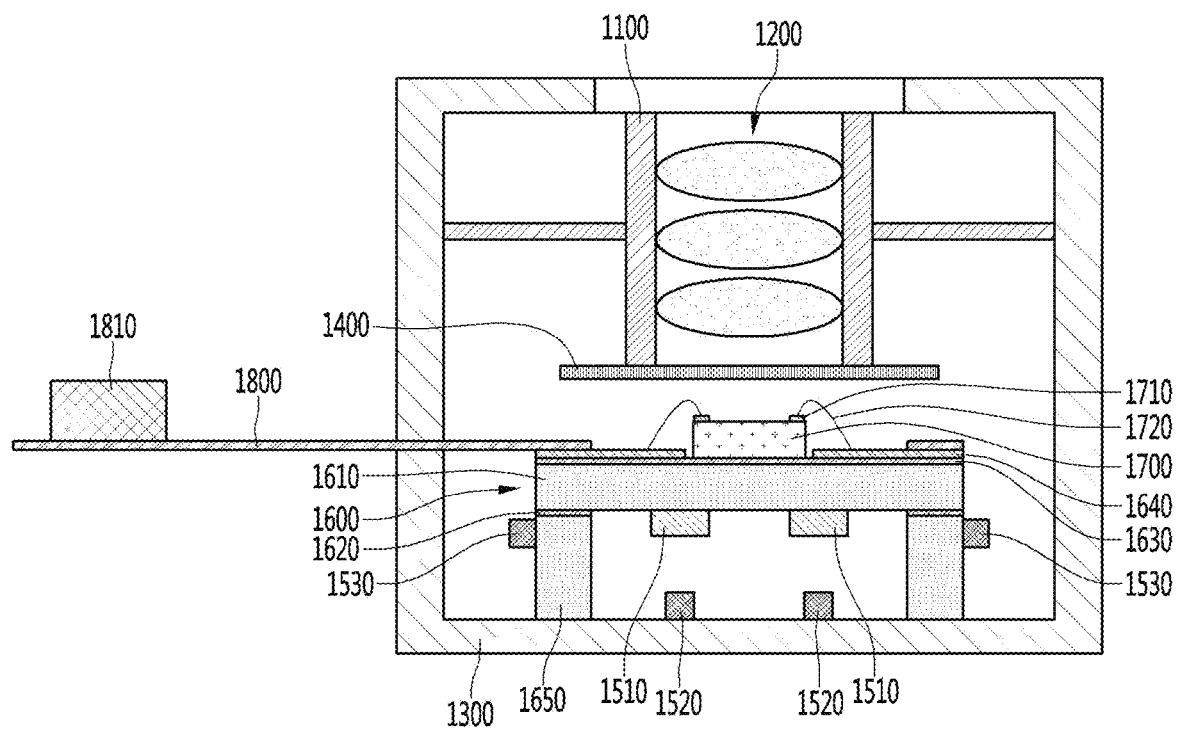
FIG. 17 is a view showing a camera device according to a second embodiment.

FIG. 17 is a view showing a camera device according to an embodiment.

Referring to FIG. 17, the camera device according to the embodiment includes a lens barrel 1100, a lens assembly 1200, a housing 1300, an infrared cut filter part 1400, a driving part 1510, 1520, 1530, an image sensor substrate 1600, an image sensor 1700, and a flexible circuit board 1800.

In the following description, a detailed description of the configuration substantially the same as that of FIG. 2 will be omitted.

Here, the lens barrel 110, the lens assembly 1200, the housing 1300, the infrared cut filter part 1400, the driving part (1510, 1520, 1530), the image sensor 1700, and the flexible circuit board 1800 are substantially the same as the corresponding configuration in FIG. 2, and a detailed description thereof will be omitted.

The image sensor substrate 1600 is a substrate on which the image sensor 1700 is mounted. Specifically, the image sensor substrate 1600 may be driven by the driving parts 1510, 1520, and 1530 to move the image sensor 1700 in the X-axis, Y-axis and Z-axis directions. In addition, the image sensor substrate 1600 may be driven by the driving parts 1510, 1520, and 1530 to tilt the image sensor 1700.

The image sensor substrate 1600 may be disposed to be spaced apart from a bottom surface of the housing 1300 at a predetermined interval. In addition, the image sensor substrate 1600 may move the image sensor 1700 relative to the housing 1300.

To this end, the image sensor substrate 1600 may include an insulating layer 1610, a first bonding sheet 1620, a conductive pattern portion 1640, and a supporting layer 1650. In addition, according to an embodiment, the image sensor substrate 1600 may further include a second bonding sheet 1630. That is, the second bonding sheet 1630 may be selectively disposed between the insulating layer 1610 and the conductive pattern portion 1640. If the second bonding sheet is included, the plane area of the second bonding sheet in one embodiment may be the same as the plane area of the insulating layer 1610, and the plane area of the second bonding sheet in another embodiment may be the same as the plane area of the conductive pattern portion 1640. This will be described with reference to FIGS. 25 and 26A and 26B.

The insulating layer 1610 may support the conductive pattern portion 1640 and move the image sensor 1700 disposed on the image sensor substrate 1600 in the X-axis, Y-axis, and Z-axis directions. To this end, the insulating layer 1610 may include an elastic region having a certain elastic force. Preferably, the insulating layer 1610 may include a plurality of elastic regions. For example, the insulating layer 1610 may include four elastic regions.

That is, at least one region of the insulating layer 1610 may have a certain elastic force, Accordingly, the image sensor substrate 1600 may be moved in the X-axis, Y-axis, and Z-axis directions while elastically supporting the image sensor substrate 1600.

A conductive pattern portion 1640 is disposed on the insulating layer 1610. The conductive pattern portion 1640 may include a lead pattern part spaced apart from each other by a predetermined interval on the insulating layer 1610. For example, the conductive pattern portion 1640 may include a first lead pattern part connected to the image sensor 1700 and a second lead pattern part connected to the flexible circuit board 1800. In addition, the conductive pattern portion 1650 may include an extension pattern part connecting the first lead pattern part and the second lead pattern part. The first lead pattern part, the second lead pattern part, and the extension pattern part will be described in detail below.

In addition, the insulating layer 1610 may include a first insulating part in which the first lead pattern part is disposed, a second insulating part in which the second lead pattern part is disposed, and an extension insulating part in which the extension pattern part is disposed. The first insulating part, the second insulating part, and the extension insulating part will be described in more detail below.

Meanwhile, a second bonding sheet 1630 may be disposed between the insulating layer 1610 and the conductive pattern portion 1640. The second bonding sheet 1630 may provide adhesive force between the insulating layer 1610 and the conductive pattern portion 1640. In this case, the second bonding sheet 1630 may have a shape corresponding to the insulating layer 1610. To this end, the second bonding sheet 1630 may include an elastic region having an elastic force corresponding to the insulating layer 1610. For example, the second bonding sheet 1630 may include a first bonding part, a second bonding part, and an extension bonding part between the first bonding part and the second bonding part.

The first bonding part of the second bonding sheet 1630 may be disposed between the first insulating part and the first lead pattern part.

The second bonding part of the second bonding sheet 1630 may be disposed between the second insulating part and the second lead pattern part.

In addition, the extension bonding part of the second bonding sheet 1630 may be disposed between the extension insulating part and the extension pattern part.

The image sensor substrate according to the embodiment provides elastic force in the extension insulating part of the insulating layer 1610, the extension bonding part of the second bonding sheet 1630, and the extension pattern part of the conductive pattern portion 1640, and the image sensor 1700 can be moved. Preferably, the extension insulating part, the extension bonding part, and the extension pattern part may also be referred to as an elastic member. In addition, the elastic member may have a layered structure including an insulating layer region, a bonding layer region, and a pattern layer region. This will be described in more detail below.

In addition, the second bonding sheet 1630 may be omitted for the image sensor substrate according to the embodiment. For example, the conductive pattern portion 1640 may be directly disposed on the insulating layer 1610 without the second bonding sheet 1630. That is, the upper surface of the extension insulating part and the lower surface of the extension pattern part may directly contact each other without the extension bonding part of the insulating layer 1610. Accordingly, in an embodiment, only the extension insulating part and the extension pattern part may serve as the elastic member without the extension bonding part.

The supporting layer 1650 may be a support substrate. A third driving part 1530 may be mounted on the supporting layer 1650, and accordingly, an electric signal may be applied to the third driving part 1530.

In addition, the third driving part 1530 may include an electromagnet, and thus may be mounted on the housing.

The supporting layer 1650 may support the insulating layer 1610. Preferably, the supporting layer 1650 may support the first bonding sheet 1620, the second bonding sheet 1630, the insulating layer 1610, the conductive pattern portion 1640 and the image sensor 1700 at a position floating from the bottom surface of the housing 1300.

The image sensor 1700 is disposed on the image sensor substrate 1600,

One end of the flexible circuit board 1800 may be connected to the image sensor substrate 1600.

To this end, a part of a region of the flexible circuit board 1800 is disposed inside the housing 1300, and accordingly, may be connected to the conductive pattern portion 1640 of the image sensor substrate 1600.

Hereinafter, the substrate 1600 for an image sensor according to the second embodiment will be described in more detail.

Figure 18:
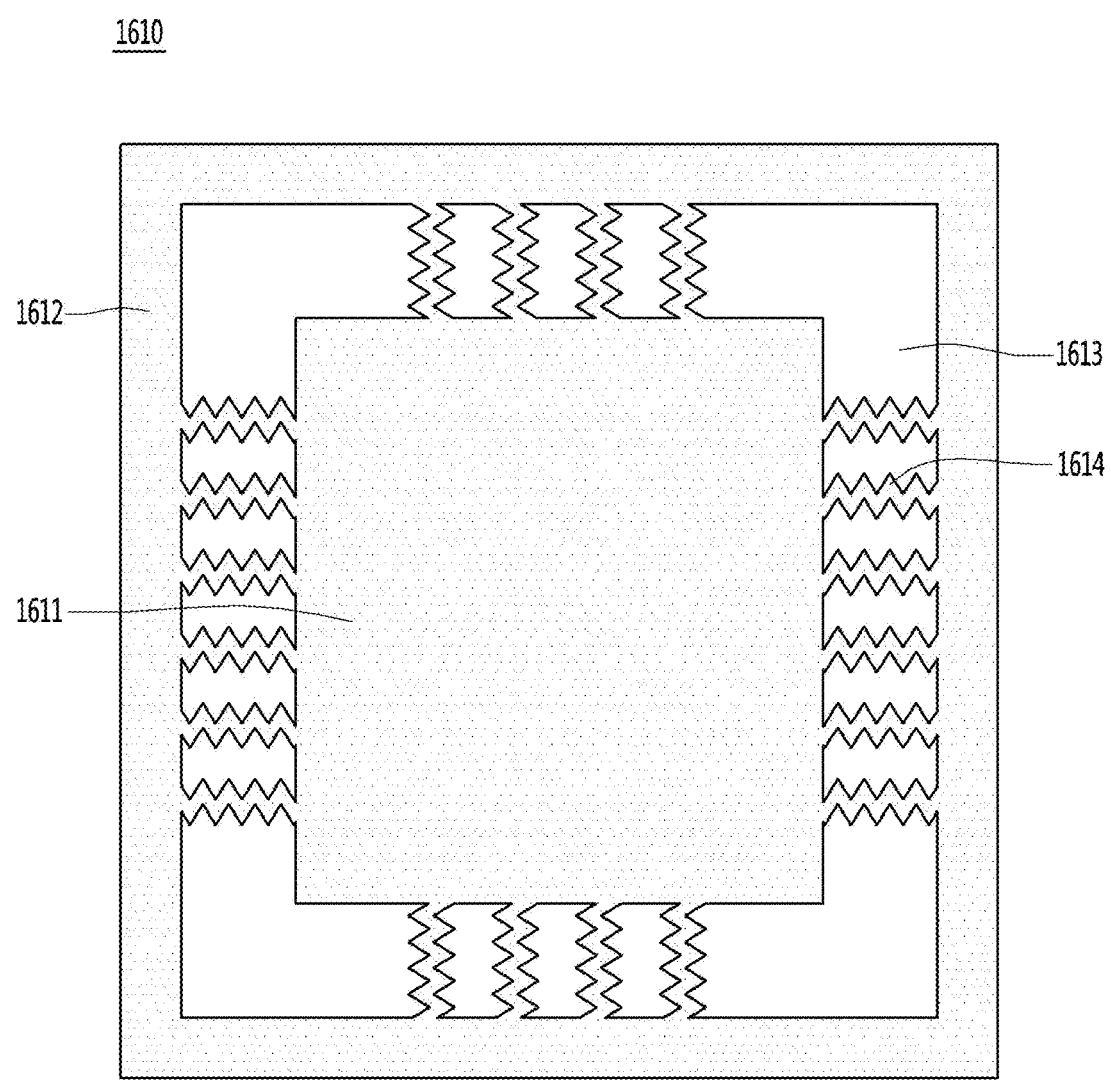
FIG. 18 is a view showing an example of the insulating layer shown in FIG. 17.

FIG. 18 is a view showing the insulating layer shown in FIG. 17.

Referring to FIG. 18, the insulating layer 1610 may elastically support the conductive pattern portion 1640 constituting the image sensor substrate 1600.

The insulating layer 1610 may have an elastic region having a certain elastic force to move the image sensor 1700 disposed on the image sensor substrate 1600 in the X-axis, Y-axis, and Z-axis directions.

To this end, the elastic region may include the extension insulating part 1614 having an elastic force of the insulating layer 1610. Specifically, the first insulating part 1611 may be disposed in the center of the insulating layer 1610. In addition, the second insulating part 1612 may be disposed around the first insulating part 1611 at a position spaced apart from the first insulating part 1611 by a predetermined distance.

In addition, the insulating layer 1610 may include the first insulating part 1611 and the second insulating part 1612, and an open region can be between the include the first insulating part 1611 and the second insulating part 1612. Preferably, the first insulating part 1611 and the second insulating part 1612 may be spaced apart from each other by the open region 1613 interposed therebetween.

In addition, the extension insulating part 1614 may have one end connected to the first insulating part 1611 and the other end connected to the second insulating part 1612. To this end, the extension insulating part 1614 may be formed in plural. Preferably, the extension insulating part 1614 may include first to fourth extension insulating parts 1614.

The first insulating part 1611 may include a plurality of outer portions. Preferably, the first insulating part 1611 may include a left outer portion, a right outer portion, an upper outer portion, and a lower outer portion.

The second insulating part 1612 may include a plurality of inner parts. Preferably, the second insulating part 1612 may include a left inner portion, a right inner portion, an upper inner portion, and a lower inner portion.

In this case, the left outer portion of the first insulating part 1611 and the left inner portion of the second insulating part 1612 may be disposed to face each other. In addition, the first extension insulating part constituting the extension insulating part 1614 may connect the left outer portion of the first insulating part 1611 and the left inner portion of the second insulating part 1612 to each other.

In addition, the right outer portion of the first insulating part 1611 and the right inner portion of the second insulating part 1612 may be disposed to face each other. In addition, the second extension insulating part constituting the extension insulating part 1614 may connect the right outer portion of the first insulating part 1611 and the right inner portion of the second insulating part 1612 to each other.

In addition, the upper outer portion of the first insulating part 1611 and the upper inner portion of the second insulating part 1612 may be disposed to face each other. In addition, the third extension insulating part constituting the extension insulating part 1614 may connect the upper outer portion of the first insulating part 1611 and the upper inner portion of the second insulating part 1612 to each other.

In addition, the lower outer portion of the first insulating part 1611 and the lower inner portion of the second insulating part 1612 may be disposed to face each other. In addition, the fourth extension insulating part constituting the extension insulating part 1614 may connect the lower outer portion of the first insulating part 1611 and the lower inner portion of the second insulating part 1612 to each other.

In addition, the first insulating part 1611, the second insulating part 1612, and the extension insulating part 1614 may be integrally formed. Accordingly, it is possible to further utilize the elastic force of the insulating layer 1610 when the image sensor is tilted, and it is possible to inhibit detachment between the first insulating part 1611, the extension insulating part 1614, and the second insulating part 1612.

That is, the insulating layer 1610 may be etched or physically punched to have a spring shape of the extension insulating part 1614 on one insulating member to form the open region 1613. Accordingly, the first insulating part 1611, the second insulating part 1612, and the extension insulating part 1614 may be formed of the same insulating material. However, the embodiment is not limited thereto.

In other words, each of the first insulating part 1611, the second insulating part 1612, and the extension insulating part 1614 may be formed in separate configurations. That is, the insulating layer 1610 according to the embodiment may be formed by further forming a configuration corresponding to the extension insulating part 1614 between the first insulating part 1611 and the second insulating part 1612, after preparing the first insulating part 1611 and the second insulating part 1614.

On the other hand, the length of the extension insulating part 1614 is set to have at least 1.5 times the linear distance between the first insulating part 1611 and the second insulating part 1612. In addition, the length of the extension insulating part 1614 is set to be 20 times or less than the linear distance between the first insulating part 1611 and the second insulating part 1614. Preferably, the length of the extension insulating part 1614 is set to be less than 4 times the linear distance between the first insulating part 1611 and the second insulating part 1612.

Here, the linear distance may mean a distance between an outer surface and an inner surface facing each other in the first insulating part 1611 and the second insulating part 1612. Preferably, the linear distance may be a distance between the left outer surface of the first insulating part 1611 and the left inner surface of the second insulating part 1612. In addition, the linear distance may be a distance between the right outer surface of the first insulating part 1611 and the right inner surface of the second insulating part 1612. Also, the linear distance may be a distance between an upper outer surface of the first insulating part 1611 and an upper inner surface of the second insulating part 1612. Also, the linear distance may be a distance between a lower outer surface of the first insulating part 1611 and a lower inner surface of the second insulating part 1612.

Meanwhile, a linear distance between the first insulating part 1611 and the second insulating part 1612 may be 1.5 mm. At this time, if less than 1.5 times the linear distance between the first insulating part 1614 and the second insulating part 1612 of the extension insulating part 1614, the mobility of the image sensor substrate 1600 may be reduced due to the decrease in elastic force of the extension insulating part 1614. In addition, if the length of the extension insulating part 1614 is greater than 20 times the linear distance between the first insulating part 1614 and the second insulating part 1612, an image sensor 1700 disposed on the insulating layer 1610 cannot be stably supported, and thus a problem may occur in movement accuracy. Accordingly, in the embodiment, in order to improve mobility, the length of the extension insulating part 1614 is set to be less than 4 times the linear distance between the first insulating part 1611 and the second insulating part 1612.

Accordingly, the extension insulating part 1614 may be formed to have a plurality of bent spring shapes in the open region 1613.

Meanwhile, at least one slit (not shown) may be formed in the first insulating part 1611 of the insulating layer 1610. The slit may be formed to maintain flatness of the insulating layer 1610. That is, the conductive pattern portion 1640 and the image sensor 1700 are disposed on the insulating layer 1610. In addition, a first driving part is disposed under the insulating layer 1610. In this case, the flatness of the first driving part or the image sensor 1700 directly affects the reliability of the camera module, and image quality may deteriorate as the flatness deteriorates. Accordingly, in the embodiment, by forming at least one slit in the insulating layer 1610, not only the weight of the insulating layer 1610 is reduced, but also the flatness can be maintained, thereby improving the overall reliability of the camera module.

Figure 19:
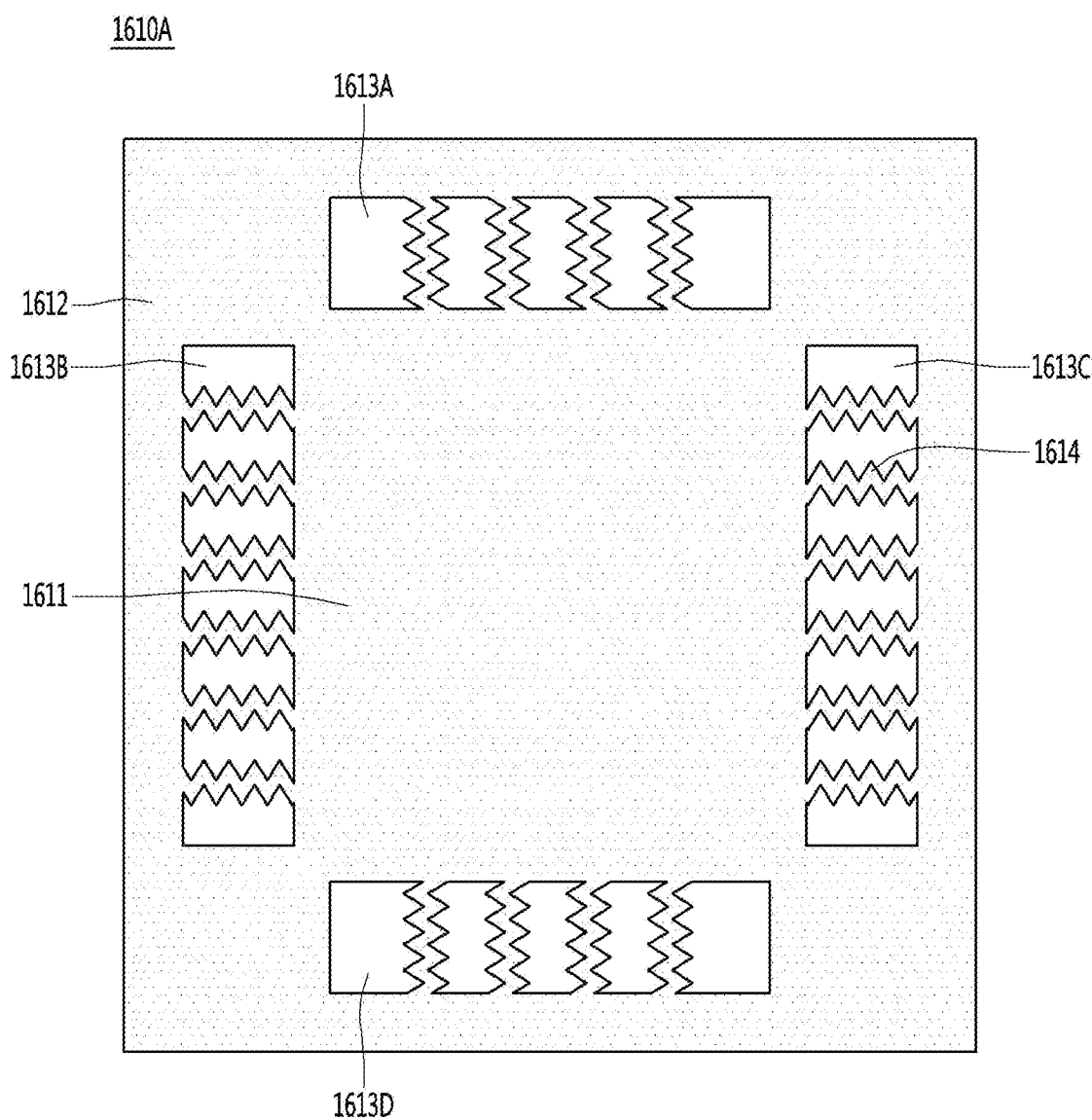
FIG. 19 is a view showing a modified example of the insulating layer shown in FIG. 17.

FIG. 19 is a view showing a modified example of the conductive pattern portion shown in FIG. 17.

Referring to FIG. 19, the insulating layer 1610A may include an insulating part 1611 and a plurality of open holes 1613A, 1613B, 1613C, and 1613D disposed in the insulating part 1611.

That is, in the first embodiment, the open region has a shape of one closed loop that is entirely disposed around the first insulating part. In contrast, in the second embodiment, a plurality of open holes 1613A, 1613B, 1613C, and 1613D are disposed at positions spaced apart from each other by a predetermined interval, so that the first and second insulating parts of the insulating layer 1610A are not separated from each other. In this case, the previously described extension insulating part 1614 may be disposed in the plurality of open holes 1613A, 1613B, 1613C, and 1613D.

In conclusion, in the modified example, the corner regions between the first and second insulating parts are interconnected, and open regions are formed only in the remaining regions excluding the corner regions. In addition, the extension insulating part 1614 is disposed in the open region. Accordingly, in a modified example, while improving the support force of the image sensor 1700 due to the increase in the strength of the insulating layer 1610, the reliability of mobility by the extension insulating part 1614 may be improved.

Figure 20:
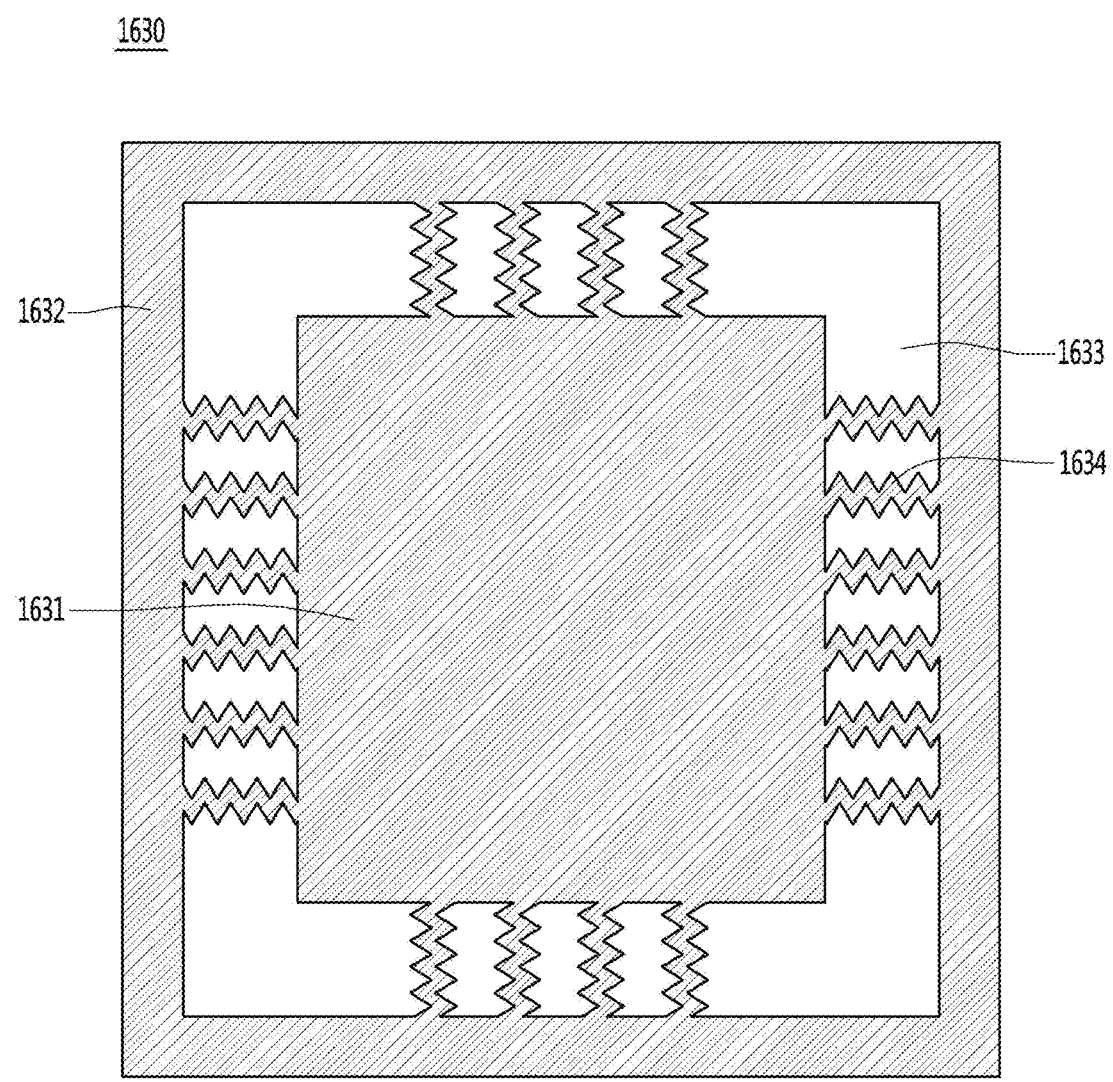
FIG. 20 is a view showing a second bonding sheet shown in FIG. 17.

FIG. 20 is a view showing a second bonding sheet shown in FIG. 17.

Referring to FIG. 20, the second bonding sheet 1630 is disposed on the insulating layer 1610. In this case, the second bonding sheet 1630 has a planar shape corresponding to the planar shape of the insulating layer 1610.

That is, the second bonding sheet 1630 may include a first bonding part 1631 disposed on the first insulating part 1611 of the insulating layer and a second bonding part 1632 disposed on the second insulating part 1612 of the insulating layer 1610. In addition, the second bonding sheet 1630 may include an open region 1633 between the first bonding part 1631 and the second bonding part 1632.

The second bonding part 1632 is disposed to surround the first bonding part 1631 at a position spaced apart from the first bonding part 1631 by a predetermined distance. In this case, the second bonding part 1632 does not directly contact the first bonding part 1631. Accordingly, the first bonding part 1631 and the second bonding part 1632 may be separated from each other through the open region 1633.

In addition, the extension bonding part 1634 connecting between the first bonding part 1631 and the second bonding part 1632 is disposed in the open region 1633. The extension bonding part 1634 has a shape corresponding to the extension insulating part 1614. The extension bonding part 1634 may be disposed in a region vertically overlapping the extension insulating part 1614. In this case, the extension bonding part 1634 may have a plane area corresponding to the extension insulating part 1614. Preferably, the plane area of the extension bonding part 1634 may be 0.9 to 1.1 times the plane area of the extension insulating part 1614. The extension bonding part 1634 of the second bonding sheet 1630 may be formed through the same process as the extension insulating part 1614 of the insulating layer 1610. Accordingly, the extension bonding part 1634 may have the same shape as the extension insulating part 1614 and have the same plane area.

The second bonding sheet 1630 may be formed of a double-sided adhesive film. The second bonding sheet 1630 may be formed of an epoxy or acrylic adhesive or a thermosetting adhesive film.

The second bonding sheet 1630 may have a thickness of 25 μm.

Meanwhile, a first bonding sheet 1610 is disposed under the insulating layer 1610. In this case, the first bonding sheet 1610 is disposed under the second insulating part 1612 of the insulating layer 1610. In other words, the first bonding sheet 1610 may be selectively formed only in a region of the lower surface of the insulating layer 1610 in which the supporting layer 1650 is disposed. Meanwhile, the supporting layer 1650 and the insulating layer 1610 may be integrally formed with each other. Accordingly, the first bonding sheet 1610 may be selectively omitted.

That is, the supporting layer 1650 may be formed by removing a portion of the lower surface of the insulating member constituting the insulating layer 1610 and the supporting layer 1650 to form a groove.

Figure 21:
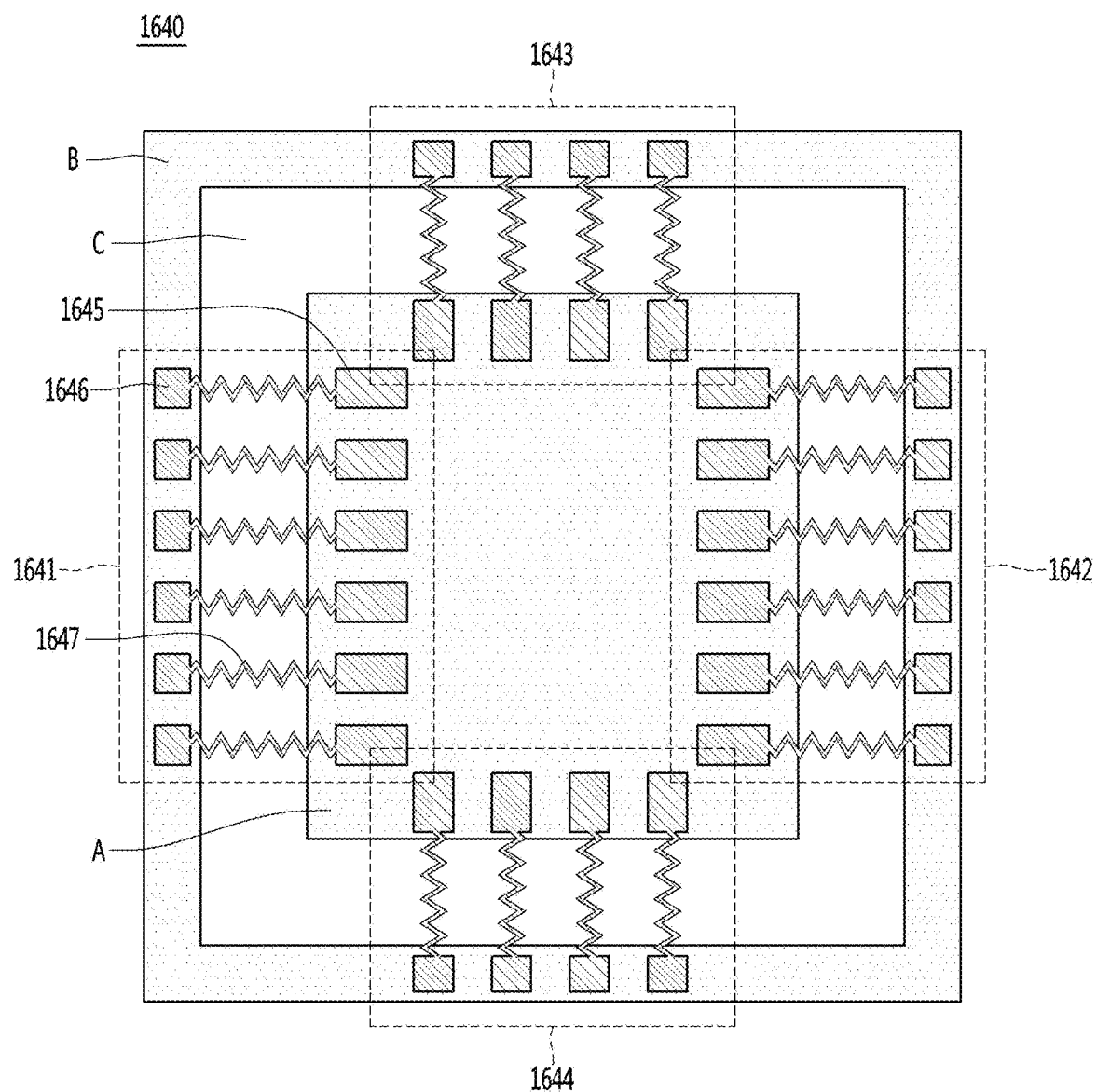
FIG. 21 is a view showing a conductive pattern portion shown in FIG. 17.

FIG. 21 is a view showing a conductive pattern portion shown in FIG. 17.

Referring to FIG. 21, the conductive pattern portion 1640 may be disposed on the insulating layer 1610 with a specific pattern. The conductive pattern portion 1640 includes a first conductive pattern part 1641 disposed on a first region of the insulating layer 1610 and a second conductive pattern part 1642 disposed on a second region of the insulating layer 1610, a third conductive pattern part 1643 disposed on a third region of the insulating layer 1610, and a fourth conductive pattern part 1644 disposed on a fourth region of the insulating layer 1610. In the drawing, a region vertically overlapping the first insulating part 1611 of the insulating layer 1610 and the first bonding part 1631 of the second bonding sheet 1630 is referred to as 'A', a region vertically overlapping the second insulating part 1612 of the insulating layer 1610 and the second bonding part 1632 of the second bonding sheet 1630 is referred to as 'B', and a region vertically overlapping the open region 1613 of the insulating layer 1610 and the open region 1633 of the second bonding sheet 1630 is referred to as 'C'.

The first conductive pattern part 1641 may be disposed on a left side of an upper surface of the insulating layer 1610. That is, the first conductive pattern part 1641 may be disposed on a left region of the first insulating part 1611, a left region of the second insulating part 1612, and the first extension insulating part 1614 connecting these. Preferably, the first conductive pattern part 6410 may be disposed on a part of the second bonding sheet on the left region of the first insulating part 1611, a part of the second bonding sheet on the left area of the second insulating part 1612, and a part of the extension bonding part connecting them to each other.

In addition, the first conductive pattern part 1641 may be disposed on the insulating layer 1610 without the second bonding sheet 1630.

The second conductive pattern part 1642 may be disposed in a right region of an upper surface of the insulating layer 1610. That is, the second conductive pattern part 1642 may be disposed on a right region of the first insulating part 1611, a right region of the second insulating part 1612 and a second extension insulating part connecting these.

The third conductive pattern part 1643 may be disposed in an upper region of the upper surface of the insulating layer 1610. That is, the third conductive pattern part 1643 may be disposed on an upper region of the first insulating part 1611, an upper region of the second insulating part 1612, and a third extension insulating part connecting these.

The fourth conductive pattern part 1644 may be disposed in a lower region of the upper surface of the insulating layer 1610. That is, the fourth conductive pattern part 1644 may be disposed on a lower region of the first insulating part 1611, a lower region of the second insulating part 1612, and a fourth extension insulating part connecting these.

As described above, the conductive pattern portions 1640 are respectively disposed on different regions, and accordingly, the elastic support force in the movement of the image sensor substrate 1600 may be increased. That is, if the conductive pattern portion 1640 is intensively disposed only in a specific area, reliability in moving the image sensor substrate 1600 in a specific direction may be lowered. For example, if the conductive pattern portion 1640 includes only the first and second conductive pattern portions, there is no problem with the movement of the image sensor substrate 1600 in the X-axis direction, stability may be deteriorated when the image sensor substrate 1600 moves in the Y-axis direction. In addition, in this case, the conductive pattern portion 1640 may be disconnected according to the periodic movement of the image sensor substrate 1600. Accordingly, in the embodiment, the conductive pattern portion 1640 is distributed in each of the four regions as described above, so that the image sensor substrate 1600 can be stably moved in the X-axis, Y-axis, and Z-axis. That is, the conductive pattern portion may be formed to be symmetrical up/down/left/right on the insulating layer 1610.

Meanwhile, the conductive pattern portion 1640 may include a first lead pattern part 1645 connected to the image sensor 1700 and a second lead pattern part 1646 connected to the flexible circuit board 1800. In addition, the conductive pattern portion 1640 may include an extension pattern part 1647 connecting between the first lead pattern part 1645 and the second lead pattern part 1646.

The first lead pattern part 1645 is disposed on the first insulating part 1611 of the insulating layer 1610. The first lead pattern part 1645 may be disposed on an outer region of the first insulating part 1611. That is, the image sensor mounting area on which the image sensor 1700 is mounted may be included on the first insulating part 1611. In this case, the image sensor mounting area may be a central area of the first insulating part 1611. Accordingly, the first lead pattern part 1645 may be disposed around the image sensor mounting area of the first insulating part 1611.

The second lead pattern part 1646 is disposed on the second insulating part 1612 of the insulating layer 1610. The second lead pattern parts 1646 may be disposed on the second insulating part 1612, respectively. In this case, the first lead pattern part 1645 and the second lead pattern part 1646 may be disposed to face each other on the first insulating part 1611 and the second insulating part 1612. That is, the number of first lead pattern parts 1645 may be the same as the number of second lead pattern parts 1646. In addition, each of the first lead pattern parts 1645 may be disposed to face the second lead pattern part 1646, respectively.

Meanwhile, the extension pattern part 1647 may be disposed between the first lead pattern part 1645 and the second lead pattern part 1646.

The extension pattern part 1647 may have one end connected to the first lead pattern part 1645 and the other end connected to the second lead pattern part 1646 facing the first lead pattern part 1645.

In this case, the extension pattern part 1647 may be disposed on the extension insulating part 1614 of the insulating layer 1610. Preferably, the extension pattern part 1647 may be disposed on the extension bonding part 1634 disposed on the extension insulating part 1614. Preferably, the extension bonding part 1634 may be disposed between the extension insulating part 1614 and the extension pattern part 1647. In addition, the upper surface of the extension bonding part 1634 may directly contact the lower surface of the extension pattern part 1647. In addition, the lower surface of the extension bonding part 1634 may directly contact the extension insulating part 1614. Preferably, the extension pattern part 1647, the extension insulating part 1614, and the extension bonding part 1634 may be overlapped and aligned in a mutually vertical direction.

The length of the extension pattern part 1647 is greater than a linear distance between the first lead pattern part 1645 and the second lead pattern part 1646. That is, the extension pattern part 1647 may be formed to have a structure that is bent a plurality of times between the first lead pattern part 1645 and the second lead pattern part 1646. Preferably, the extension pattern part 1647 may be formed to have a spring shape between the first lead pattern part 1645 and the second lead pattern part 1646.

At this time, the extension pattern part 1647 may be formed by etching to have the above shape through an additive process, a subtractive process, a modified semi-additive process (MSAP), a semi-additive process (SAP), and the like. Preferably, the extension pattern part 1647 may be formed simultaneously with the first lead pattern part 1645 and the second lead pattern part 656. More preferably, the extension pattern part 1647 may be integrally formed with the first lead pattern part 1645 and the second lead pattern part 1646.

Meanwhile, the thickness of the conductive pattern portion 1640 including the extension pattern part 1647, the first lead pattern part 1645, and the second lead pattern part 1646 may be 10 μm to 50 μm. For example, the thickness of the conductive pattern portion 1640 may be 30 μm to 40 μm. In this case, when the thickness of the conductive pattern portion 1640 is less than the conductive pattern portion 1640 may be broken when the image sensor substrate 1600 moves. In addition, when the thickness of the conductive pattern portion 1640 is greater than 50 μm, elastic force of the extension pattern part 1647 may be lowered, thereby hindering the mobility of the image sensor substrate 1600. Accordingly, in the embodiment, the thickness of the conductive pattern portion 1640 is set to be 35 μm±5 μm such that the image sensor substrate 1600 may be stably moved.

In addition, the length of the extension pattern part 1647 is set to have at least 1.5 times the linear distance between the first lead pattern part 1645 and the second lead pattern part 1646. In addition, the length of the extension pattern part 1647 is set to be 20 times or less of the linear distance between the first lead pattern part 1645 and the second lead pattern part 1646. Preferably, the length of the extension pattern part 1647 is set to be less than or equal to 4 times the linear distance between the first lead pattern part 1645 and the second lead pattern part 1646.

The linear distance between the first lead pattern part 1645 and the second lead pattern part 1646 may be 1.5 mm.

In this case, when the length of the extension pattern part 1647 is smaller than 1.5 times the linear distance between the first lead pattern part 1645 and the second lead pattern part, the mobility of the image sensor substrate 1600 may be reduced due to the decrease in the elastic force of the extension pattern part 1647. In addition, when the length of the extension pattern part 1647 is greater than 20 times the linear distance, a resistance increases as a signal transmission distance is increased by the extension pattern part 1647, and accordingly, noise may be included in a signal transmitted via the extension pattern part 1647. Accordingly, in order to minimize noise generation, the length of the extension pattern part 1647 is set to be 4 times or less the linear distance between the first lead pattern part 1645 and the second lead pattern part 164.

Meanwhile, the line width of the extension pattern part 1647 may be smaller than the line width of the extension insulating part 1614. Accordingly, the extension insulating part 1614 may include a first region overlapping with the extension pattern part 1647 in a vertical direction, and a second region excluding the first region. In this case, when the line width of the extension pattern part 1647 is smaller than the line width of the extension insulating part 1614, the lower surface of the extension pattern part 1647 may be exposed as the lower surface of the insulating layer 1610. In addition, due to such exposure, the extension pattern part 1647 may contact other components while the image sensor 1700 is moving, and thus reliability may be problematic. Accordingly, in the embodiment, the line width of the extension insulating part 1614 is larger than the line width of the extension pattern part 1647 disposed thereon.

Figure 22:
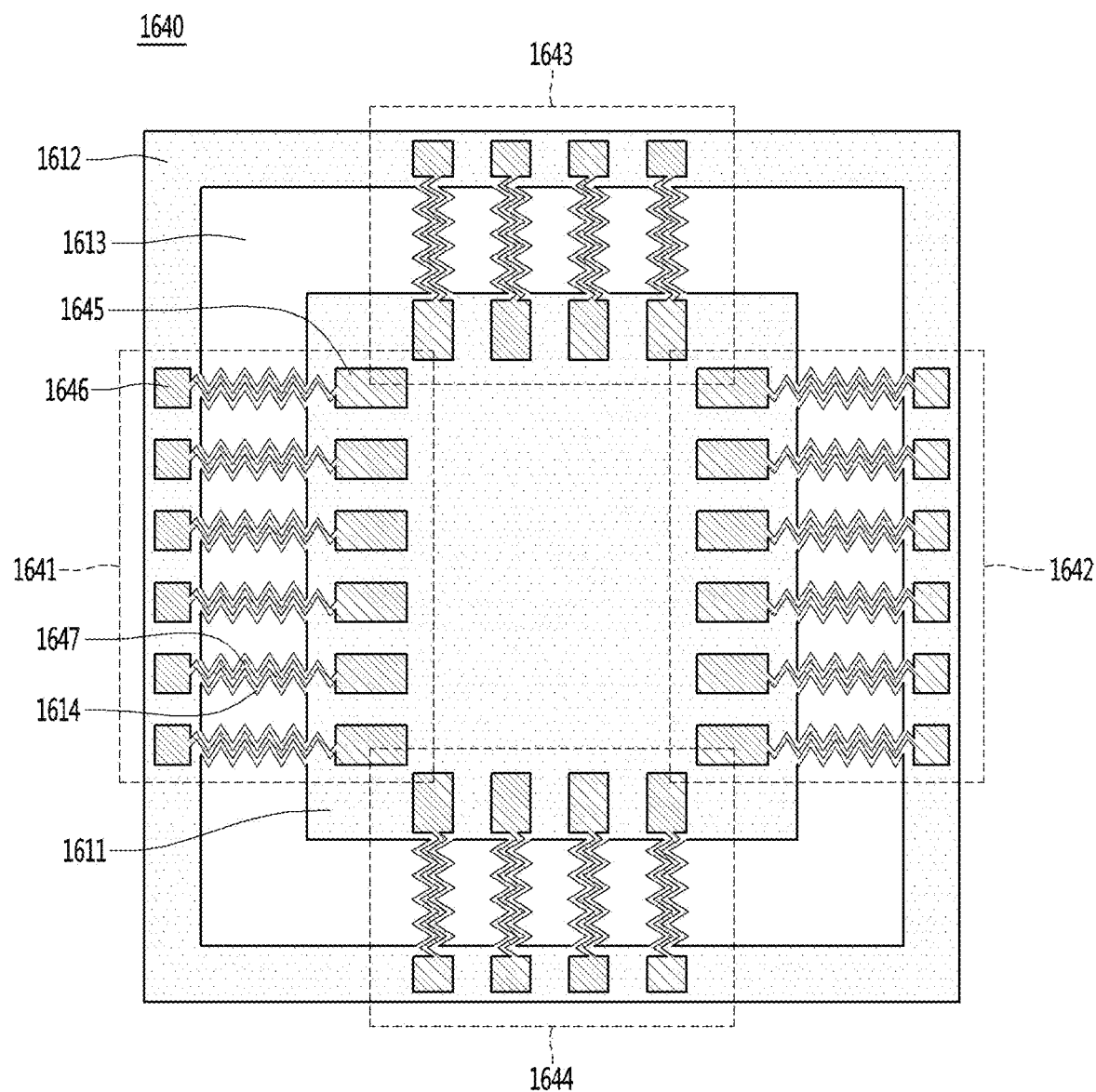
FIG. 22 is a plan view of a substrate for an image sensor according to a second embodiment.

FIG. 22 is a plan view of a substrate for an image sensor according to a second embodiment.

Referring to FIG. 22, the conductive pattern portion 1640 is disposed on the insulating layer 1610. In this case, an open region is formed in each of the insulating layers 1610. In addition, the second bonding sheet 1630 may be disposed on the insulating layer 1610. In addition, the conductive pattern portion 1640 is disposed on the second bonding sheet 1630. In this case, open regions are formed in each of the insulating layer 1610 and the second bonding sheet 1630, and the open regions may overlap each other in a vertical direction.

In addition, an elastic member having an elastic force may be disposed in each of the open regions. Here, the elastic member may be a part of the insulating layer 1610, or a part of the insulating layer 1610 and a part of the second bonding sheet 1630. That is, the elastic member may be formed as a part of the insulating layer 1610 or/and the second bonding sheet 1630. That is, the extension insulating part 1614 having a bent shape that is bent a plurality of times is disposed in the open region of the insulating layer 1610. The extension insulating part 1614 may have a spring shape. In addition, an extension bonding part 1634 having a bent shape that is bent a plurality of times is disposed in the open region of the second bonding sheet 1630. The extension bonding part 1634 may have a spring shape.

In addition, the extension bonding part 1634 and the extension insulating part 1614 may have the same shape while having the same planar area.

Meanwhile, each of line widths of the extension bonding part 1634 and the extension insulating part 1614 may be larger than the line width of the extension pattern part 1647. Accordingly, when the image sensor substrate is viewed from above, at least a part of the extension bonding part 1634 and the extension insulating part 1614 positioned under the extension pattern part 1647 may be exposed.

At this time, the image sensor substrate 1600 may move not only in the X-axis direction and the Y-axis direction, but also in the Z-axis direction. At this time, there is a difference between the elastic modulus of the extension bonding part 1634 and the extension insulating part 1614 and the elastic modulus of the extension pattern part 1647. Accordingly, when the image sensor substrate 1600 moves in the Z-axis direction, the movement distances of the extension bonding part 1634 and the extension insulating part 1614 may appear differently. In addition, this causes a situation in which the extension pattern part 1647 is in contact with a constituent portion of another metal material, thereby causing an electrical reliability problem (eg, a short). Accordingly, in the embodiment, the line widths of the extension insulating part 1614 and the extension insulating part 1614 are made larger than the line width of the extension pattern part 1647 as described above, so that the electrical reliability problem can be solved.

Figure 23:
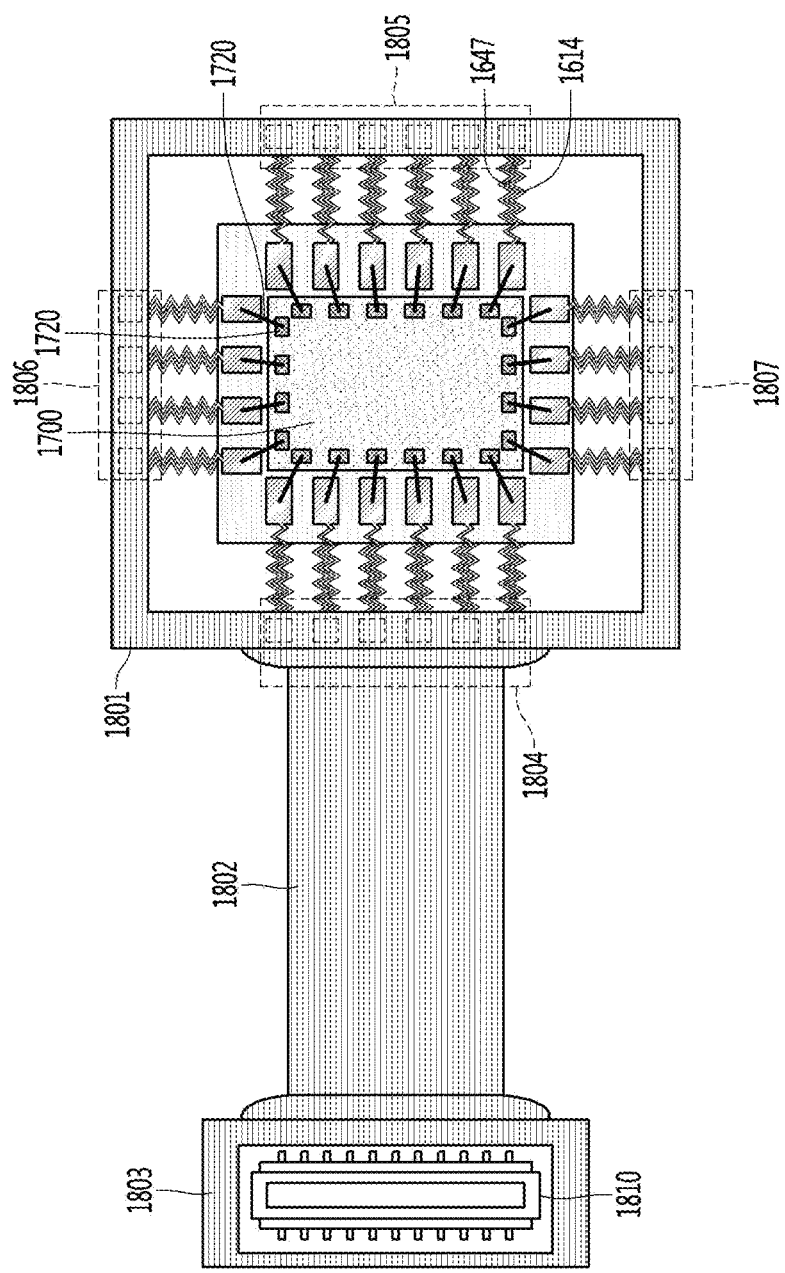
FIG. 23 is a view showing a connection structure between a flexible circuit board and an image sensor substrate according to a second embodiment.

FIG. 23 is a view showing a connection structure between a flexible circuit board and an image sensor board according to a second embodiment.

Referring to FIG. 23, the flexible circuit board 1800 electrically connects the image sensor board 1600 and an external main board (not shown) to each other.

One end of the flexible circuit board 1800 may be connected to the image sensor substrate 1600. The flexible circuit board 1800 may receive an electrical signal output from the image sensor 1700. The flexible circuit board 1800 may include a connector 1810 at the other end. A main board (not shown) may be connected to the connector 1810.

That is, the flexible circuit board 1800 may connect the camera module and the main board of the external device. Specifically, the flexible circuit board 1800 may connect between the conductive pattern portion 1650 of the image sensor substrate 1600 of the camera module and the main board of a portable terminal.

To this end, an area of the flexible circuit board 1800 is disposed inside the housing 1300, and accordingly, may be connected to the conductive pattern portion 1650 of the image sensor substrate 1600.

That is, the flexible circuit board 1800 may include a first connector part 1801, a second connector part 1803, and a connection part 1802.

The first connector part 1801 may be disposed inside the housing 1300. The first connector part 1801 may include a plurality of pads 1804, 1805, 1806, and 1807 connected to the conductive pattern portion 1640.

The first connector part 1801 may be electrically connected to the second lead pattern part 1646 of the conductive pattern portion 1640. That is, the plurality of pad portions 1804, 1805, 1806, and 1807 of the first connector part 1801 may be electrically connected to the second lead pattern part 1646.

To this end, the first connector part 1801 may include a first pad part 1804 connected to the second lead pattern part 1646 of the first conductive pattern part 1641. In addition, the first connector part 1801 may include a second pad part 1805 connected to the second lead pattern part 1646 of the second conductive pattern part 1642. Further, the first connector part 1801 may include a third pad part 1806 connected to the second lead pattern part 1646 of the third conductive pattern part 1643. Further, the first connector part 1801 may include a fourth pad part 1807 connected to the second lead pattern part 1646 of the fourth conductive pattern part 1644.

In this case, the first connector part 1801 has a shape corresponding to the second insulating part 1612 of the insulating layer 1610, and it may be disposed surrounding the upper region of the second lead pattern part 1646 of the conductive pattern portion 1640, and the plurality of pad portions 1804, 1805, 1806, and 1807 may be disposed on a lower surface thereof.

The connection part 1802 connects the first connector part 1801 and the second connector part 1803. A part of the connection part 1802 may be disposed in the housing 1300, and may be extended therefrom to be exposed to the outside of the housing 1300.

The second connector part 1803 may include a connector 1810 connected to the main board of the terminal.

Meanwhile, the image sensor 1700 may be attached on the first insulating part 1631 of the insulating layer 1610. In this case, the image sensor 1700 may be attached on the first insulating part 1611 so that the electrode 710 faces upward.

In addition, a connection member 1720, such as a metal wire, is formed between the electrode 710 of the image sensor 1700 and the first lead pattern part 1645, so that the connection member 1720 may electrically connect the electrode of the image sensor and the first lead pattern part.

Figure 24:
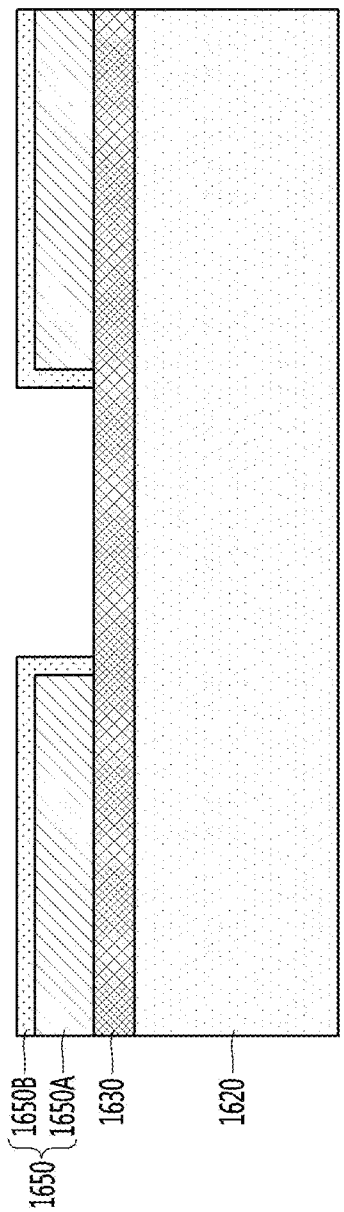
FIG. 24 is a view specifically showing a layer structure of a conductive pattern portion according to a second embodiment.

FIG. 24 is a diagram specifically illustrating a layer structure of a conductive pattern portion according to a second exemplary embodiment.

Referring to FIG. 24, the conductive pattern portion 1640 is disposed on the second bonding sheet 1630 disposed on the insulating layer 1610. In this case, the conductive pattern portion 1640 includes a first lead pattern part 1645 disposed on the first insulating part 1611 of the insulating layer 1610, a second lead pattern part 1646 disposed on the second insulating part 1612, and an extension pattern part 1647 connecting therebetween.

In this case, each of the first lead pattern part 1645, the second lead pattern part 1646, and the extension pattern part 1647 may include a metal layer 1640A and a plating layer 1640B.

The metal layer 1640A may be disposed on the second bonding sheet 1630. That is, the metal layer 1640A is disposed on the second bonding sheet 1630 to configure the first lead pattern part 1645, the second lead pattern part 1646, and the extension pattern part 1647, respectively The plating layer 1640B may be disposed on the metal layer 1640A. Preferably, the plating layer 1640B may be a surface treatment layer disposed on the metal layer 1640A.

The plating layer 1640B includes any one of Ni/Au alloy, gold (Au), electroless nickel immersion gold (ENIG), Ni/Pd alloy, and organic compound plating (Organic Solderability Preservative, OSP).

In this case, the plating layers 1640B constituting the first lead pattern part 1645 and the second lead pattern part 1646 may correspond to each other. Alternatively, the plating layer 1640B constituting the extension pattern part 1647 may have the same thickness as the plated layer 650B constituting the first lead pattern part 1645 and the second lead pattern part 1646.

That is, the plating layer 1640B of each of the first lead pattern part 1645, the second lead pattern part 1646 and the extension pattern part 1647 may be formed on the upper and side surfaces the corresponding metal layer 1640A.

Meanwhile, the thickness of the plating layer 1640B may be 0.3 µm to 1 µm. For example, the thickness of the plating layer 1640B may be 0.3 µm to 0.7 µm. The thickness of the plating layer 1640B may be 0.3 µm to 0.5 µm.

Figure 25:
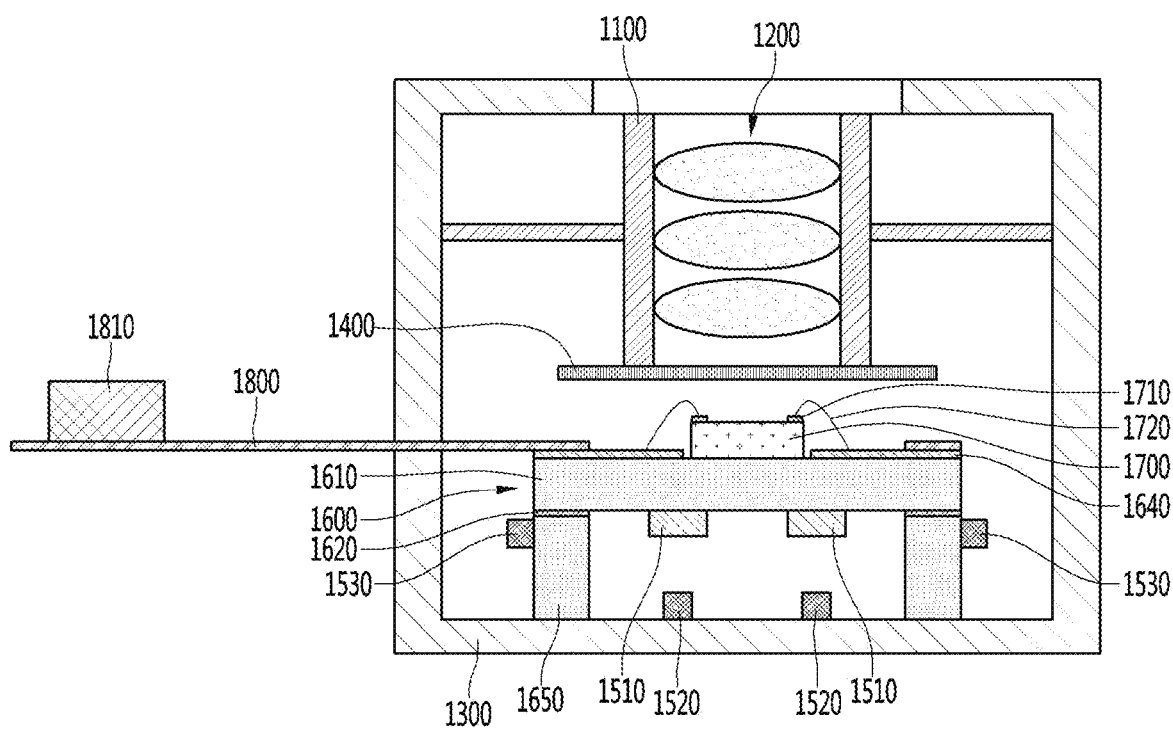
FIG. 25 is a view showing a camera device according to a third embodiment.

FIG. 25 is a view showing a camera device according to a third embodiment. Prior to the description of FIG. 25, components that are substantially the same as those of FIG. 17 are denoted by the same reference numerals.

Referring to FIG. 25, the camera device may include a lens barrel 1100, a lens assembly 1200, a housing 1300, an infrared cut filter part 1400, a driving part 1510, 1520, 1530, an image sensor substrate 1600, an image sensor 1700, and a flexible circuit board 1800. Here, a lens barrel 1100, a lens assembly 1200, a housing 1300, an infrared cut filter part 1400, a driving part 1510, 1520, 1530, an image sensor 1700, and a flexible circuit board 1800 are substantially the same as the structure of FIG. 17, and thus a detailed description thereof will be omitted.

The image sensor substrate 1600 in FIG. 25 may include an insulating layer 1610, a first bonding sheet 1620, a conductive pattern portion 1640, and a supporting layer 1650. That is, compared with the image sensor substrate of FIG. 17, in the image sensor substrate of FIG. 25, the second bonding sheet has been removed on the insulating layer 1610, and accordingly, the conductive pattern portion 1640 may be disposed in direct contact with the insulating layer 1610. In this case, a bonding layer (not shown) may be selectively disposed on the insulating layer 1610 only in a region where the image sensor 1700 is disposed.

The structures of the insulating layer 1610 and the conductive pattern portion 1640 in FIG. 25 are the same as those of the insulating layer and the conductive pattern portion 1640 described with reference to FIG. 17. Accordingly, the upper surface of the first insulating part 1611 may directly contact the lower surface of the first lead pattern part 1645. In addition, the upper surface of the second insulating part 1612 may directly contact the lower surface of the second lead pattern part 1646. In addition, the upper surface of the extension insulating part 1614 may directly contact the lower surface of the extension pattern part 1647.

Figure 26A:
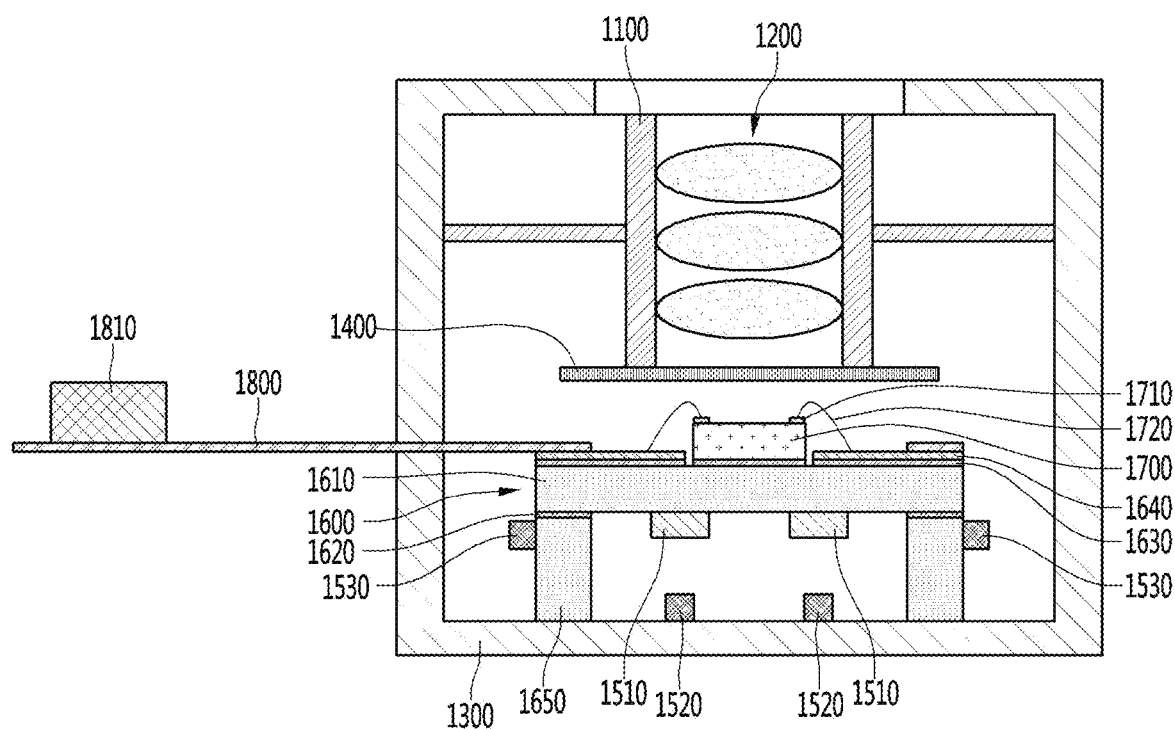
FIG. 26A and FIG. 26B are views showing a camera device according to a fourth embodiment.
Figure 26B:
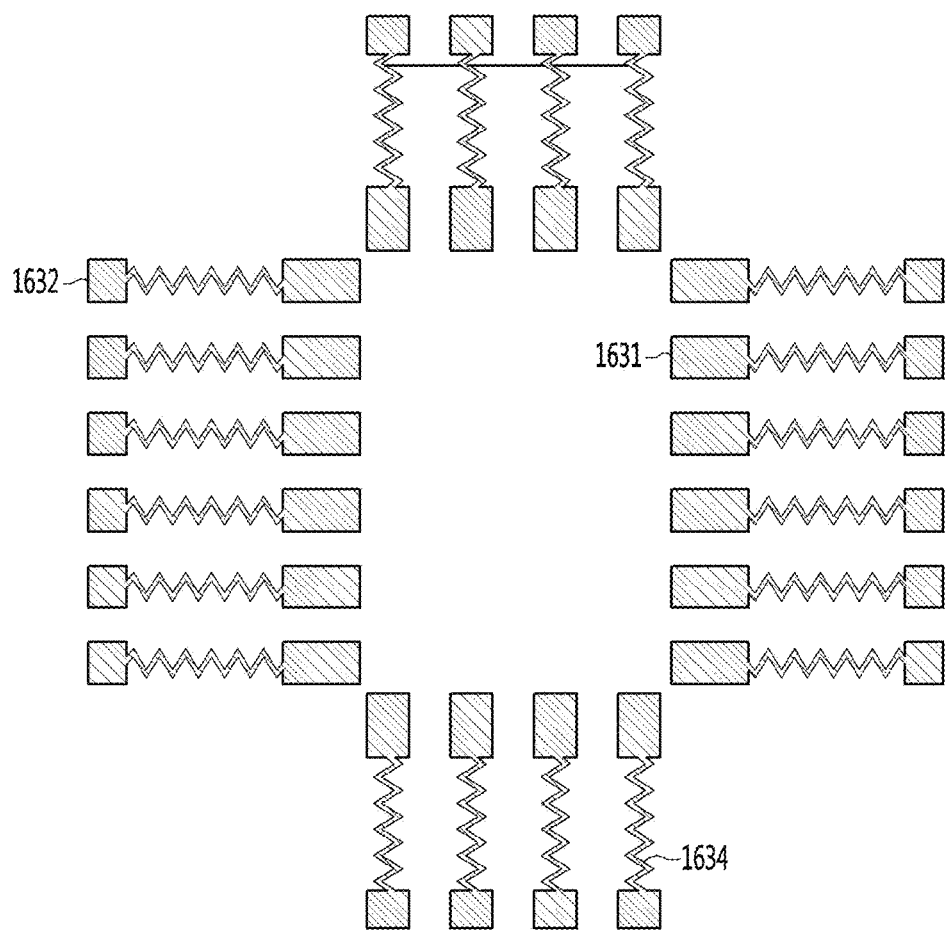

FIG. 26A is a view showing a camera device according to a fourth embodiment, and FIG. 26B is a plan view of a second bonding sheet in FIG. 26A. Prior to the description of FIGS. 26A and 26B, the same reference numerals are assigned to substantially the same components as those of FIG. 17.

FIG. 26A and FIG. 26B, the camera device may include a lens barrel 1100, a lens assembly 1200, a housing 1300, an infrared cut filter part 1400, a driving part 1510, 1520, and 1530, and an image sensor substrate 1600, an image sensor 1700, and a flexible circuit board 1800. Here, a lens barrel 1100, a lens assembly 1200, a housing 1300, an infrared cut filter part 1400, a driving part 1510, 1520, 1530, an image sensor 1700, and a flexible circuit board 1800 are substantially the same as the structure of FIG. 17, and thus a detailed description thereof will be omitted.

The image sensor substrate 1600 in FIGS. 26A and 26B may include an insulating layer 1610, a first bonding sheet 1620, a second bonding sheet 1630, a conductive pattern part 1640, and a support layer 1650. That is, compared with the image sensor substrate of FIG. 17, the second bonding sheet 1630 of the image sensor substrate of FIG. 26A may be disposed only in a partial area on the insulating layer 1610. That is, the second bonding sheet 1630 may be selectively disposed only in a region of the upper surface of the insulating layer 1610 in which the conductive pattern portion 1640 is to be disposed.

That is, referring to FIG. 26B, the second bonding sheet 1630 may include a first bonding part 1631, a second bonding part 1632, and an extension bonding part 1634.

The first bonding part 1631 may be disposed between the first insulating part 1611 and the first lead pattern part 1645. The first bonding part 1631 may have a shape corresponding to the first lead pattern part 1645. Preferably, the first bonding part 1631 may have a plane area equal to that of the first lead pattern part 1645.

The second bonding part 1632 may be disposed between the second insulating part 1612 and the second lead pattern part 1646. The second bonding part 1632 may have a shape corresponding to the second lead pattern part 1646. Preferably, the second bonding part 1632 may have the same plane area as the plane area of the second lead pattern part 1646.

The extension bonding part 1634 may be disposed between the extension insulating part 1614 and the extension pattern part 1647. The extension bonding part 1634 may have a shape corresponding to the extension pattern part 1647. Preferably, the extension bonding part 1634 may have the same plane area as that of the extension pattern part 1647.

Meanwhile, the second bonding sheet 1630 in the embodiment may be a seed layer of the conductive pattern portion 1640. Accordingly, when the conductive pattern portion 1640 is patterned, the second bonding sheet 1630 may also be removed together with the conductive pattern portion 1640, and accordingly, the second bonding sheet 1630 may have the same shape as the conductive pattern portion 1640.

According to an embodiment, in order to implement the OIS and AF functions of the camera module, instead of moving the conventional lens barrel, the image sensor is moved relative to the lens barrel in the X-axis, Y-axis and Z-axis directions. Accordingly, the camera module according to the embodiment may remove a complex spring structure for implementing the OIS and AF functions, and thus the structure may be simplified. In addition, by moving the image sensor according to the embodiment relative to the lens barrel, it is possible to provide a stable structure compared to the conventional structure.

In addition, according to an embodiment, the extension pattern part electrically connected to the image sensor has a spring structure and is disposed in a floating form on the spring plate.

In addition, in the insulating layer, an extension insulating part having a spring shape is disposed in a region vertically overlapping with the extension pattern part. Accordingly, the camera module may elastically support the image sensor more stably and move the image sensor with respect to the lens barrel.

In addition, the length of the extension pattern part in the embodiment is set to be at least 1.5 to 4 times the linear distance between the first lead pattern part and the second lead pattern part. Accordingly, noise generation can be minimized while improving the mobility of the image sensor substrate.

In addition, in the embodiment, the width of the extension insulating part is made larger than the width of the extension pattern part, so that the extension pattern part can be stably supported by the extension insulating part, thereby improving operational reliability.

In addition, according to the embodiment, the elastic member and the extension pattern part are not aligned with each other in a vertical direction, thereby solving an electrical reliability problem that may occur due to contact between the elastic member and the extension pattern part.

The invention claimed is:

1. A substrate for an image sensor comprising:
an insulating layer including a first open region; and
a conductive pattern portion disposed on the insulating layer,
wherein the insulating layer comprises:
a first insulating part;
a second insulating part spaced apart from the first insulating part with the first open region interposed therebetween; and
an extension insulating part connecting the first insulating part and the second insulating part, and
wherein the conductive pattern portion comprises:
a first lead pattern part disposed on the first insulating part;
a second lead pattern part disposed on the second insulating part; and
an extension pattern part disposed on the first open region of the insulating layer to connect the first lead pattern part with the second lead pattern part and including a bent portion, and
wherein the extension pattern part and the extension insulating part are overlapped with each other in an optical axis direction.

2. The substrate of claim 1, wherein the extension pattern part includes a plurality of extension patterns spaced apart from each other on the first open region, and wherein the extension insulating part includes a plurality of extension insulating parts respectively corresponding to the plurality of extension patterns and spaced apart from each other on the first open region.

3. The substrate of claim 1, wherein a length of the extension pattern part is greater than a linear distance between the first lead pattern part and the second lead pattern part.

4. The substrate of claim 3, wherein the extension pattern part has a length of between 1.5 and 4 times the linear distance between the first lead pattern part and the second lead pattern part.

5. The substrate of claim 1, wherein a line width of the extension insulating part is greater than a line width of the extension pattern part.

6. The substrate of claim 5, wherein the extension insulating part is overlapped with the extension pattern part in an optical axis direction, and wherein the extension pattern part is disposed on the extension insulating part.

7. The substrate of claim 6, wherein the extension pattern part has a spring shape including a plurality of bent portions, and wherein the extension insulating part has a shape corresponding to the extension pattern part.

8. The substrate of claim 1, wherein the first lead pattern part, the second lead pattern part, and the extension pattern part comprise:
a metal layer, and
a plating layer disposed on the metal layer.

9. The substrate of claim 1, wherein the extension pattern part is formed of a binary alloy of any one of copper (Cu)-nickel (Ni), copper (Cu)-tin (Sn), copper (Cu)-beryllium (Be) and copper (Cu)-cobalt (Co), or a ternary alloy of any one of copper (Cu)-nickel (Ni)-tin (Sn) and copper (Cu)-beryllium (Be)-cobalt (Co).

10. The substrate of claim 1, wherein the insulating layer comprises:
an elastic insulating part disposed in the first open region and connecting between the first and second insulating parts, and
wherein the elastic insulating part does not overlap with the extension pattern part in an optical axis direction.

11. The substrate of claim 1, wherein the extension pattern part does not overlap with a corner region of the first open region.

12. The substrate of claim 1, wherein a line width of the extension pattern part is smaller than a line width of each of the first and second lead pattern parts, and wherein the extension pattern part does not overlap the first insulating portion and the second insulating part in an optical axis direction.

13. A camera module comprising:
a housing;
a lens barrel disposed in the housing;
a lens assembly disposed in the lens barrel;
an image sensor substrate disposed in the housing and including an insulating layer including a first open region, and a conductive pattern portion disposed on the insulating layer; wherein the insulating layer comprises a first insulating part, and a second insulating part spaced apart from the first insulating part with the first open region interposed therebetween; wherein the conductive pattern portion comprises a first lead pattern part disposed on the first insulating part, a second lead pattern part disposed on the second insulating part, and an extension pattern part disposed on the first open region of the insulating layer to connect the first lead pattern part with the second lead pattern part and including a bent portion;
an image sensor disposed on the first lead pattern portion of the image sensor substrate; and
a flexible circuit board including a pad connected to the second lead pattern part of the image sensor substrate,
wherein the insulating layer of the image sensor substrate comprises an extension insulating part connecting the first insulating part and the second insulating part, and
wherein a line width of the extension insulating part is greater than a line width of the extension pattern part.

14. The camera module of claim 13, comprising a driving part disposed on the insulating layer of the image sensor substrate to move the image sensor.

15. A substrate for an image sensor comprising:
a plate;
an insulating layer disposed on the plate and including a first open region; and
a conductive pattern portion disposed on the insulating layer;
wherein the plate includes first and second plate parts spaced apart from each other with a second open region therebetween, and a connection part disposed in the second open region and connecting the first and second plate parts,
wherein the insulating layer comprises a first insulating part disposed on the first plate part, a second insulating part spaced apart from the first insulating part with the first open region interposed therebetween and disposed on the second plate part, and an extension insulating part connecting the first insulating part and the second insulating part, and
wherein the conductive pattern portion comprises a first lead pattern part disposed on the first insulating part, a second lead pattern part disposed on the second insulating part, and an extension pattern part disposed on the first open region of the insulating layer to connect the first lead pattern part with the second lead pattern part and including a bent portion.

16. The substrate of claim 15, wherein the extension pattern part does not overlap with the connection part in an optical axis direction.

17. The substrate of claim 15, wherein the first open region is overlapped with the second open region in an optical axis direction.

18. The substrate of claim 15, wherein the first plate part has a through hole passing through upper and lower surfaces of the first plate part.

19. The substrate of claim 15, wherein the connection part is disposed in a corner region of the second open region, and wherein the extension pattern part does not overlap with a corner region of the first open region and the corner region of the second open region in an optical axis direction.

* * * * *